US012598791B2

(12) United States Patent
Zhu et al.

(10) Patent No.: US 12,598,791 B2
(45) Date of Patent: Apr. 7, 2026

(54) STORAGE DEVICE, METHOD FOR MANUFACTURING THE SAME, AND ELECTRONIC APPARATUS INCLUDING STORAGE DEVICE

(71) Applicants: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

(72) Inventors: Huilong Zhu, Poughkeepsie, NY (US); Qi Wang, Beijing (CN)

(73) Assignees: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 377 days.

(21) Appl. No.: 18/262,193

(22) PCT Filed: Nov. 26, 2021

(86) PCT No.: PCT/CN2021/133338
§ 371 (c)(1),
(2) Date: Jul. 19, 2023

(87) PCT Pub. No.: WO2023/087364
PCT Pub. Date: May 25, 2023

(65) Prior Publication Data
US 2024/0120382 A1 Apr. 11, 2024

(30) Foreign Application Priority Data
Nov. 19, 2021 (CN) .......................... 202111381873.8

(51) Int. Cl.
*H10D 62/13* (2025.01)
*H10B 12/00* (2023.01)
(Continued)

(52) U.S. Cl.
CPC ....... *H10D 62/151* (2025.01); *H10B 12/0335* (2023.02); *H10B 12/05* (2023.02);
(Continued)

(58) Field of Classification Search
CPC ........ H10N 50/01; H10N 50/80; H10N 50/85; H10B 61/22; H10B 61/00
See application file for complete search history.

(56) References Cited

U.S. PATENT DOCUMENTS

| | | | |
|---|---|---|---|
| 6,191,445 B1 | 2/2001 | Fujiwara | |
| 2005/0199913 A1* | 9/2005 | Hofmann | ............... H10B 43/30 438/257 |

(Continued)

FOREIGN PATENT DOCUMENTS

| | | |
|---|---|---|
| CN | 102376707 A | 3/2012 |
| CN | 102693986 A | 9/2012 |

(Continued)

OTHER PUBLICATIONS

International Search Report and Written Opinion dated Jun. 28, 2022, for corresponding PCT Application No. PCT/CN2021/133338.

(Continued)

*Primary Examiner* — Brian Turner
(74) *Attorney, Agent, or Firm* — Kinney & Lange, P.A.

(57) ABSTRACT

A storage device includes a substrate, a storage unit array, and word lines extending in the first direction. The storage unit array includes storage units arranged along a first direction and a second direction. Each storage unit includes: an active region extending in a third direction and including (Continued)

a vertical stack of first source/drain, channel and second source/drain layers, and a gate stack between the first and second source/drain layers in a vertical direction and sandwiching the channel layer from at least two opposite sides. First source/drain layers of each column are continuous to form a bit line extending in the second direction in a zigzag shape. Each word line extends in the first direction to intersect the active regions of a respective row, and is electrically connected to the gate stack of each storage unit on two opposite sides of the channel layer.

20 Claims, 22 Drawing Sheets

(51) Int. Cl.

| | |
|---|---|
| *H10D 30/01* | (2025.01) |
| *H10D 30/43* | (2025.01) |
| *H10D 30/67* | (2025.01) |
| *H10D 62/10* | (2025.01) |
| *H10D 62/40* | (2025.01) |

(52) U.S. Cl.

CPC ......... *H10B 12/315* (2023.02); *H10B 12/482* (2023.02); *H10B 12/488* (2023.02); *H10D 30/014* (2025.01); *H10D 30/43* (2025.01); *H10D 30/6728* (2025.01); *H10D 30/6735* (2025.01); *H10D 30/6757* (2025.01); *H10D 62/121* (2025.01); *H10D 62/405* (2025.01)

(56) References Cited

U.S. PATENT DOCUMENTS

| | | | |
|---|---|---|---|
| 2007/0087499 A1 | 4/2007 | Seo et al. | |
| 2014/0054676 A1 | 2/2014 | Nam et al. | |
| 2016/0133639 A1* | 5/2016 | Tran | G11C 16/26 |
| | | | 257/319 |
| 2019/0074363 A1 | 3/2019 | Zhu | |
| 2019/0157345 A1* | 5/2019 | Zhu | H10B 61/00 |
| 2021/0074334 A1* | 3/2021 | Zhu | G11C 5/063 |
| 2021/0335789 A1 | 10/2021 | Zhu | |

FOREIGN PATENT DOCUMENTS

| | | |
|---|---|---|
| CN | 103811344 A | 5/2014 |
| CN | 106992182 A | 7/2017 |
| CN | 109285836 A | 1/2019 |
| CN | 109285838 A | 1/2019 |
| CN | 109461738 A | 3/2019 |
| CN | 212136451 U | 12/2020 |
| CN | 114121960 A | 3/2022 |
| GB | 0321985 | 10/2003 |
| JP | 2005293759 A | 10/2005 |
| JP | WO2019124350 A1 | 12/2020 |
| KR | 20080028129 A | 3/2008 |
| KR | 20080082353 A | 9/2008 |
| WO | 2018058812 A1 | 4/2018 |

OTHER PUBLICATIONS

Chinese Office Action for Chinese Application No. 202111381873. 8, dated May 6, 2024, 15 pages.

* cited by examiner

1007

1013
1011
1009

1007

1005

1003

1001

A           A'

1015

1007

1015

1007

1005

1003

1001

A                                                            A'

1015
1007
1005
1003
1017
1001
A                                                            A'

1015
1007
1019
1017
1001
A                                                            A'

1017

1033
(WL)

1003
(BL)

STORAGE DEVICE, METHOD FOR MANUFACTURING THE SAME, AND ELECTRONIC APPARATUS INCLUDING STORAGE DEVICE

CROSS-REFERENCE TO RELATED APPLICATION(S)

The present application is a Section 371 National Stage Application of International Application No. PCT/CN2021/133338, filed Nov. 26, 2021, entitled "STORAGE DEVICE, METHOD FOR MANUFACTURING THE SAME, AND ELECTRONIC APPARATUS INCLUDING STORAGE DEVICE", which claims priority to Chinese Patent Application No. 202111381873.8, entitled "STORAGE DEVICE, METHOD FOR MANUFACTURING THE SAME, AND ELECTRONIC APPARATUS INCLUDING STORAGE DEVICE", filed Nov. 19, 2021, the contents of which are incorporated herein by reference.

TECHNICAL FIELD

The present disclosure relates to a field of semiconductors, in particular to a storage device, a method for manufacturing the same, and an electronic apparatus including a storage device.

BACKGROUND

In order to meet a demand for larger storage capacity, an integration level of the storage device is getting higher and higher, thus a further size reduction of the storage unit is desired. However, such size reduction is becoming increasingly difficult, especially for a horizontal device.

SUMMARY

In view of above, an objective of the present disclosure is at least in part to provide a storage device capable of reducing the size while ensuring an on-current, a method for manufacturing the same, and an electronic device including the storage device.

According to an aspect of the present disclosure, there is provided a storage device including: a substrate; a storage unit array disposed on the substrate, where the storage unit array includes a plurality of storage units arranged in a row along a first direction and a column along a second direction intersecting the first direction; and a plurality of word lines extending in the first direction on the substrate. Each of the storage units includes: an active region extending in a third direction different from the first direction and the second direction, where the active region includes a vertical stack of a first source/drain layer, a channel layer, a second source/drain layer, and a gate stack disposed between the first source/drain layer and the second source/drain layer in a vertical direction and sandwiching the channel layer from at least two opposite sides of the channel layer. First source/drain layers in active regions of each column of storage units are continuous, so as to form a bit line continuously extending in the second direction in a zigzag shape. Each of the word lines extends in the first direction to intersect each of the active regions of a respective row of storage units, and is electrically connected to the gate stack of each storage unit on two opposite sides of a channel layer of the unit.

According to another aspect of the present disclosure, there is provided a method for manufacturing a storage device, including: providing a plurality of strips on a substrate such that the plurality of strips are spaced apart from each other in a first direction and continuously extend in a second direction in a zigzag shape, where each of the strips includes a first source/drain layer, a channel layer and a second source/drain layer that are stacked sequentially in a vertical direction, the first direction and the second direction intersect, and each of the strips includes a first segment extending in a third direction between the first direction and the second direction, and a second segment alternately provided with the first segment in the second direction; defining active regions of a plurality of storage units through the plurality of strips respectively, wherein each of the active regions comprises a vertical stack of a first source/drain layer, a channel layer, and a second source/drain layer at a position of the first segment corresponding to the active region; a channel layer and a second source/drain layer in each vertical stack are discontinuous from a channel layer and a second source/drain layer in another vertical stack, and the first source/drain layers of the active regions defined through a same strip continuously extend to form a respective bit line; and vertical stacks defined through different strips are arranged in a row along the first direction, and vertical stacks defined through a same strip are arranged in a column along the second direction; and forming a plurality of word lines extending in the first direction on the substrate, wherein each of the word lines extends in the first direction to intersect the active regions of a respective row, and is electrically connected to the gate stacks of the storage units corresponding to the word line.

According to yet another aspect of the present disclosure, there is provided an electronic apparatus including the storage device described above.

According to embodiments of the present disclosure, a storage unit manufactured based on a vertical device may occupy less area than a storage unit based on a horizontal device. In addition, an on-current may be increased by optimizing an orientation of an active region of the device.

BRIEF DESCRIPTION OF THE DRAWINGS

The above and other objectives, features and advantages of the present disclosure will be more apparent through the following description of embodiments of the present disclosure with reference to the accompanying drawings.

FIG. 25 (*b*) schematically shows a layout of a bit line in a storage device according to an embodiment of the present disclosure;

In the accompanying drawings:

FIG. 1(*a*), FIG. 2(*a*), FIG. 3(*a*), FIG. 8(*a*), FIG. 12(*a*), FIG. 13(*a*), FIG. 14, FIG. 15, FIG. 16(*a*), FIG. 18(*a*), FIG. 19, FIG. 20(*a*), FIG. 21(*a*), FIG. 22(*a*), FIG. 23(*a*), and FIG. 24(*a*) show top views, where a position of the line AA' is shown in FIG. 2(*a*), a position of the line BB' is shown in FIG. 12(*a*), a position of the line CC' is shown in FIG. 13(*a*), a position of the line DD' is shown in FIG. 21(*a*), a position of the line EE' is shown in FIG. 22(*a*), and a position of the line FF' is shown in FIG. 23(*a*);

FIG. 1(*b*) shows a section in a vertical direction;

FIG. 25(*a*) and FIG. 25(*b*) show sectional views.

Throughout the drawings, the same or similar reference numerals represent the same or similar components. The accompanying drawings are not necessarily drawn to scale, and especially for the sake of clarity, the drawing scales of the sections are different from those of the top views.

DETAILED DESCRIPTION OF EMBODIMENTS

Figure 1A:
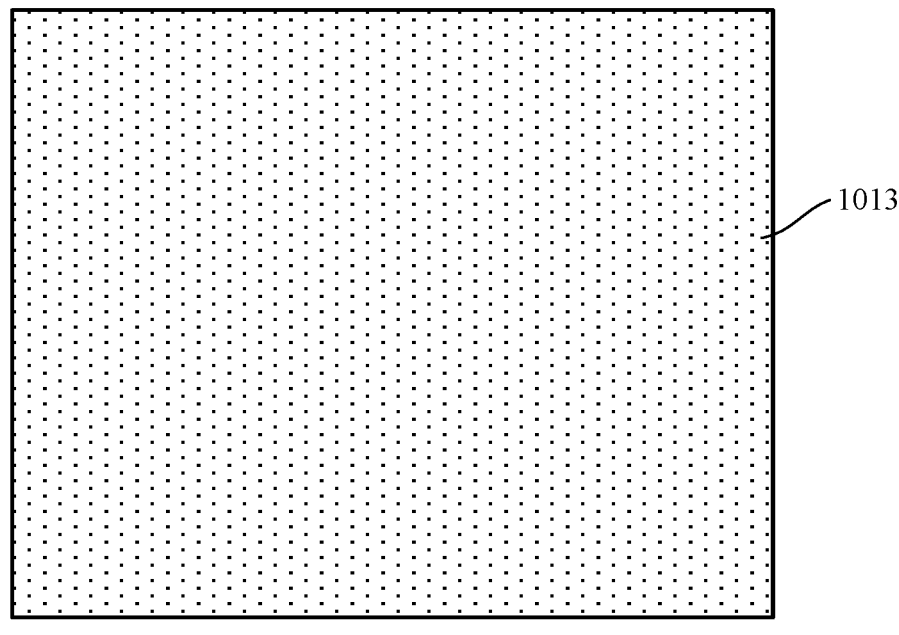
FIG. 1(*a*) to FIG. 24(*d*) schematically show some stages in a process of manufacturing a storage device according to an embodiment of the present disclosure.

Embodiments of the present disclosure will be described below with reference to the accompanying drawings. However, it should be understood that these descriptions are merely exemplary and are not intended to limit the scope of the present disclosure. In addition, in the following description, descriptions of well-known structures and technologies are omitted to avoid unnecessarily obscuring the concepts of the present disclosure.

Various schematic structural diagrams according to the embodiments of the present disclosure are shown in the accompanying drawings. The drawings are not drawn to scale. Some details are enlarged and some details may be omitted for clarity of presentation. Shapes of various regions and layers as well as the relative size and positional relationship thereof shown in the drawings are only exemplary. In practice, there may be deviations due to manufacturing tolerances or technical limitations, and those skilled in the art may additionally design regions/layers with different shapes, sizes, and relative positions according to actual needs.

In the context of the present disclosure, when a layer/element is referred to as being "on" another layer/element, the layer/element may be directly on the other layer/element, or there may be an intermediate layer/element between them. In addition, if a layer/element is located "on" another layer/element in one orientation, the layer/element may be located "under" the other layer/element when the orientation is reversed.

According to an embodiment of the present disclosure, there is provided a storage device. The storage device is based on a vertical metal oxide field effect transistor (MOSFET). Compared with a horizontal MOSFET, the vertical MOSFET may occupy less area and have a smaller leakage current, but an on-current thereof may be relatively small. According to a concept of the present disclosure, the on-current of the vertical MOSFET may be optimized by setting an orientation of the vertical MOSFET, such as an angle with respect to a bit line (or a word line), and therefore the on-current may be guaranteed while reducing the size.

The on-current of the vertical MOSFET may flow in a vertical direction (e.g., in a direction substantially perpendicular to a surface of a substrate). For example, the vertical MOSFET may include a vertical stack of a first source/drain layer, a channel layer, and a second source/drain layer. A gate stack may be disposed facing the channel layer to define a channel region in the channel layer. Source and drain regions may be respectively formed in the first source/drain layer and the second source/drain layer, and may be electrically connected to each other through the channel region.

One of the source and drain regions may be electrically connected to a data storage structure such as a capacitor, so as to form a storage unit (a configuration of dynamic random access memory (DRAM) may be obtained). The other of the source and drain regions may be electrically connected to the bit line (BL), and the gate stack may be electrically connected to the word line (WL). The storage unit may be addressed through the word line and the bit line. Storage units may be arranged into a row in a first direction and a column in a second direction, so as to form a storage unit array. The first direction intersects with (e.g., is perpendicular to) the second direction. The WL may extend in the first direction, and the BL may extend in the second direction.

As described above, the orientation of the vertical stack (especially the channel layer therein) may be optimized to increase the on-current. Specifically, the vertical stack (especially the channel layer therein) may extend in a third direction which is between the first direction and the second direction. For example, the vertical stack (especially the channel layer therein) may extend inclined with respect to the BL (or the WL), e.g., at an angle of about 30 degrees to 80 degrees, so as to increase a channel width and therefore increase the on-current. In addition, the orientation of the vertical stack may be set along a specific crystal face on which carriers may have an increased mobility, for example, the electrons on a (100) crystal face.

The gate stack may be disposed on at least two opposite sides of the channel layer (in a fourth direction orthogonal to the third direction), so that a double-gate configuration may be obtained. Alternatively, the gate stack may even surround the channel layer, so that a gate-all-around configuration may be obtained. The WL may extend in the first direction to intersect a vertical stack corresponding to the WL, and may be in contact with the gate stack on two opposite sides and therefore be electrically connected to the gate stack. According to the embodiments, the gate stack (e.g., a gate conductor layer in the gate stack) and the WL may be formed integrally to simplify the process steps, thereby reducing the costs.

According to the embodiments, the BL may be formed in a self-aligned manner. Specifically, first source/drain layers of the respective storage units in the same column may be continuous, so as to form a BL continuously extending in the second direction in a zigzag shape. Thus, the BL may be self-aligned to the storage units corresponding to the BL, which may help to save space.

The channel layer may include a single crystallographic semiconductor material. Certainly, the first source/drain layer and the second source/drain layer may also include a single crystallographic semiconductor material. For example, they may be formed by epitaxial growth.

The semiconductor device may be manufactured, for example, as follows.

A plurality of strips may be provided on the substrate, and each strip may include a first source/drain layer, a channel layer, and a second source/drain layer which are stacked sequentially in the vertical direction. The plurality of strips may be spaced apart from each other in the first direction and continuously extend in the second direction in a zigzag shape. More specifically, each strip may include a first segment extending in the third direction between the first direction (e.g., a WL direction) and the second direction (e.g., a BL direction) and a second segment alternating with the first segment in the second direction. As described below, the strip may be formed by a spacer pattern transfer technology.

An active region (i.e., the vertical stack described above) of the storage unit may be defined through a strip, especially through a first segment of the strip. For example, the second source/drain layer and the channel layer (and optionally, an upper portion of the first source/drain layer) may be removed from a local region of each strip, and the second source/drain layer and the channel layer of each strip may be separated into a localized portion at a position of the first segment, while the first source/drain layer may be continuously extending (so as to form the BL).

According to the embodiments of the present disclosure, the WL may be integral with the gate stack (especially the gate conductor layer therein). For example, recess portions are defined between the first source/drain layer and the second source/drain layer of each storage unit, where the recess portions are located on two opposite sides of the channel layer in a fourth direction orthogonal to the third direction. A gate dielectric layer and a gate conductor layer may be formed sequentially, and may be filled into the recess portions to form the gate stack (thus to be self-aligned to the channel layer). The gate conductor layer may be patterned as the WL extending in the first direction. The patterning may substantially not affect the gate conductor layer filled in the recess portions.

According to the embodiments of the present disclosure, a thickness and a gate length of the channel layer (e.g., a nanosheet or a nanowire) may be mainly determined by the epitaxial growth rather than an etching or photolithography process, and thus a channel size/thickness and gate length of the channel layer may be well controlled.

The present disclosure may be presented in various forms, some examples of which will be described below. In the following descriptions, a selection of various materials is involved. In the selection of materials, in addition to a consideration of the functions of the materials (for example, a semiconductor material may be used to form the active region, and a dielectric material may be used to form an electrical isolation), an etching selectivity is also considered. In the following descriptions, a required etching selectivity may be indicated, or may not be indicated. It should be clear to those skilled in the art that when it is mentioned below that a material layer is etched, if it is not mentioned or shown that other layer(s) are also etched, then such etching process may be a selective etching process, and the material layer may have an etching selectivity with respect to other layers exposed to a same etching formula.

FIG. 1(a) to FIG. 25(b) schematically show some stages in a process of manufacturing a storage device according to an embodiment of the present disclosure.

Figure 1B:
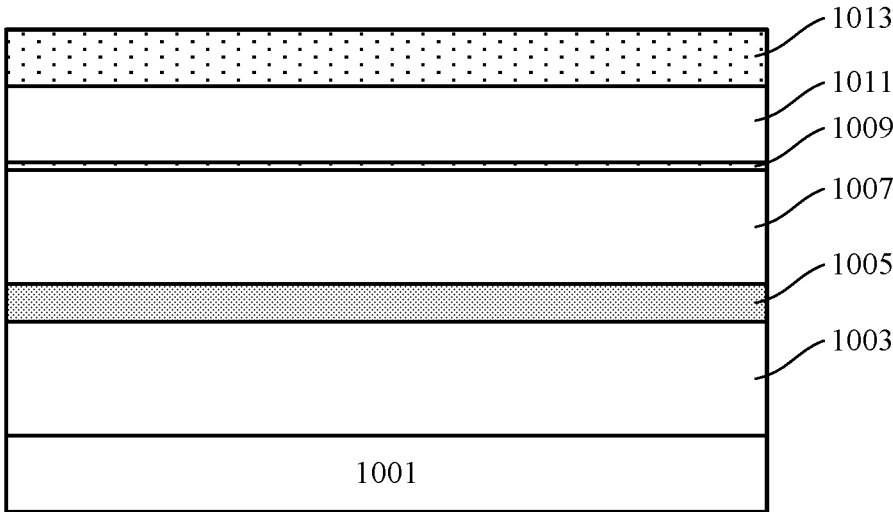

As shown in FIG. 1(a) and FIG. 1(b), a substrate 1001 is provided. The substrate 1001 may be of various types, including but not limited to a bulk semiconductor material substrate such as a bulk Si substrate, a semiconductor-on-insulator (SOI) substrate, a compound semiconductor substrate such as a SiGe substrate, and the like. In the following description, for ease of description, the bulk Si substrate is illustrated by way of example. Here, a silicon wafer is provided as the substrate 1001.

A well region may be formed in the substrate 1001. If a p-type device is to be formed, the well region may be an n-type well; and if an n-type device is to be formed, the well region may be a p-type well. Generally, in a DRAM, the storage unit is based on the n-type device. For example, the p-type well may be formed by implanting a p-type dopant, such as boron (B), into the substrate 1001 and then performing a thermal annealing. For example, the ion implantation may employ an energy of about 30 KeV to 300 KeV, a doping concentration of about $1E19/cm^3$ to $1E21/cm^3$, and an implantation angle of about 0 to 30 degrees.

Hereinafter, a formation of the n-type device is illustrated by way of example. It will be clear to those skilled in the art that the following description is also applicable to the p-type device by, for example, appropriately changing a conductive type of the dopant.

On the substrate 1001, a first source/drain layer 1003, a channel defining layer 1005, and a second source/drain layer 1007 may be formed by, for example, an epitaxial growth process. The first source/drain layer 1003 may be used to define a position of a lower source/drain portion, and may have a thickness of, for example, about 50 nm to 300 nm. The channel defining layer 1005 may be used to define a position of the channel, and may have a thickness of, for example, about 30 nm to 150 nm. The second source/drain layer 1007 may be used to define a position of an upper source/drain portion, and may have a thickness of, for example, about 50 nm to 300 nm.

Adjacent layers in the first source/drain layer 1003, the channel defining layer 1005, and the second source/drain layer 1007 may have an etching selectivity with respect to each other. For example, the first source/drain layer 1003 may include Si, the channel defining layer 1005 may include SiGe (an atomic percentage of Ge may be, for example, about 10% to 40%), and the second source/drain layer 1007 may include Si.

The first source/drain layer 1003 and the second source/drain layer 1007 may be doped in situ during their growth, so as to (at least partially) define doping characteristics of the source/drain portions. For example, an n-type dopant, such as phosphorus (P), may be doped at a concentration of about $1E18/cm^3$ to $1E21/cm^3$.

Subsequently, the active region may be defined from the first source/drain layer 1003, the channel defining layer 1005, and the second source/drain layer 1007. In order to avoid the photolithography limitation, according to the embodiments of the present disclosure, the spacer pattern transfer technology may be used in the following patterning process. In order to form a spacer, a mandrel pattern may be formed. For example, a layer 1011 for the mandrel pattern may be formed on the second source/drain layer 1007 by, for example, a deposition process, such as a chemical vapor deposition (CVD) process. For example, the layer 1011 for the mandrel pattern may include amorphous silicon or polysilicon, with a thickness of about 50 nm to 400 nm. In addition, for a better etching control, an etching stop layer 1009 may be first formed by, for example, deposition such as CVD. For example, the etching stop layer 1009 may include an oxide (e.g., silicon oxide) with a thickness of about 5 nm to 30 nm.

On the layer 1011 for the mandrel pattern, a hard mask layer 1013 may be formed by, for example, deposition such as CVD. For example, the hard mask layer 1013 may include an oxide with a thickness of about 50 nm to 400 nm.

The layer 1011 for the mandrel pattern may be patterned into the mandrel pattern.

Figure 2A:
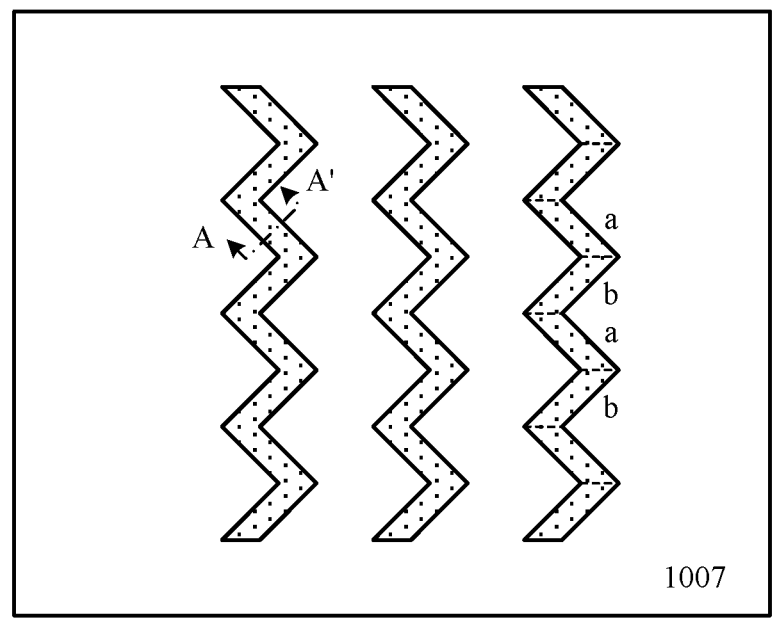
FIG. 2(*b*), FIG. 3(*b*), FIG. 4 to FIG. 7, FIG. 8(*b*), FIG. 9 to FIG. 11, FIG. 12(*b*), FIG. 16(*b*), FIG. 17, FIG. 18(*b*), and FIG. 20(*b*) shows sections taken along the line AA.
Figure 2A:
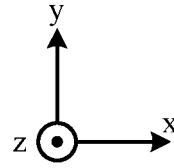
Figure 2B:
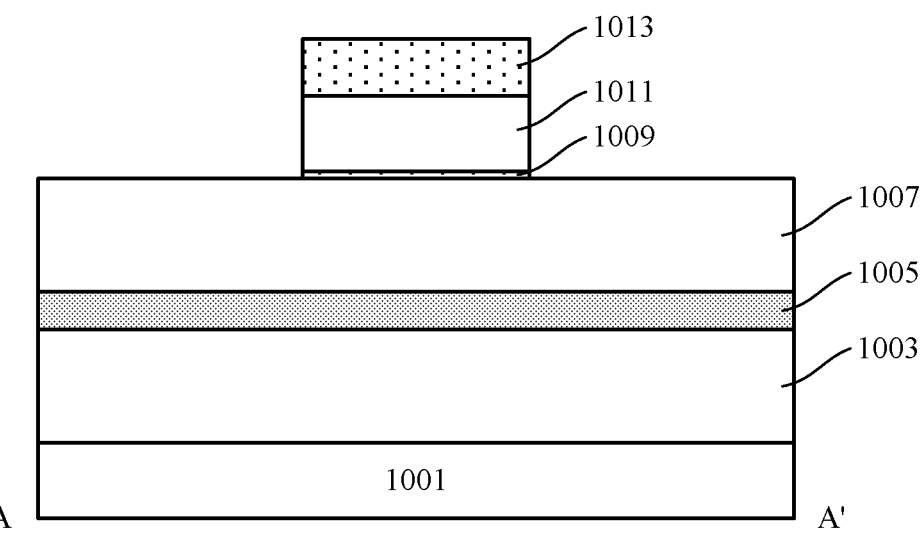

For example, as shown in FIG. 2(a) and FIG. 2(b), a patterned photoresist (not shown) may be formed on the hard mask layer 1013 by a photolithography process (where a minimum layout critical dimension (CD) may be about 20 nm to 60 nm). The patterned photoresist may be used as an etching mask, and the hard mask layer 1013, the layer 1011 for the mandrel pattern, and the etching stop layer 1009 may be selectively etched sequentially by, for example, a reactive ion etching (RIE) process. The RIE may be performed in the vertical direction, the RIE performed on the layer 1011 for the mandrel pattern may be stopped at the etching stop layer 1009, and the RIE performed on the etching stop layer 1009 may be stopped at the second source/drain layer 1007. After that, the photoresist may be removed.

FIG. 2(*a*) schematically shows lateral directions x and y, and a vertical direction z. The x and y directions may be parallel to a top surface of the substrate 1001 and may intersect with each other, e.g., the x and y directions may be perpendicular to each other. The z direction may be substantially perpendicular to the top surface of the substrate 1001.

Here, the mandrel pattern (still denoted by 1011 for convenience) is formed as a plurality of strips spaced apart in the x direction (which may be referred to as "the first direction"), and each strip extends in the y direction (which may be referred to as "the second direction") in a zigzag shape. More specifically, each strip of the mandrel pattern 1011 may include a plurality of segments a extending parallel to each other, and a plurality of segments b (which may also extend parallel to each other) alternately disposed with the segments a in the y direction, and the segments a and the segments b are continuous with each other in the y direction. These segments may be inclined (i.e., at a non-orthogonal angle) with respect to the y direction. For example, a longitudinal extension direction (which may be referred to "the third direction") of the segment a may be at about 30 degrees to 80 degrees with respect to the y direction, and a longitudinal extension direction of the segment b may be at about 30° to 80° with respect to the y direction. The angle of the segment a with respect to the y direction and the angle of the segment b with respect to the y direction may be the same or different. In addition, a length of the segment a and a length of the segment b may be the same or different, for example, the length may be about 10 nm to 100 nm. In addition, the third direction may be along a specific crystal face, such as the (100) crystal face, so as to improve the mobility of carriers (which are electrons in the case of the n-type device).

Figure 3A:
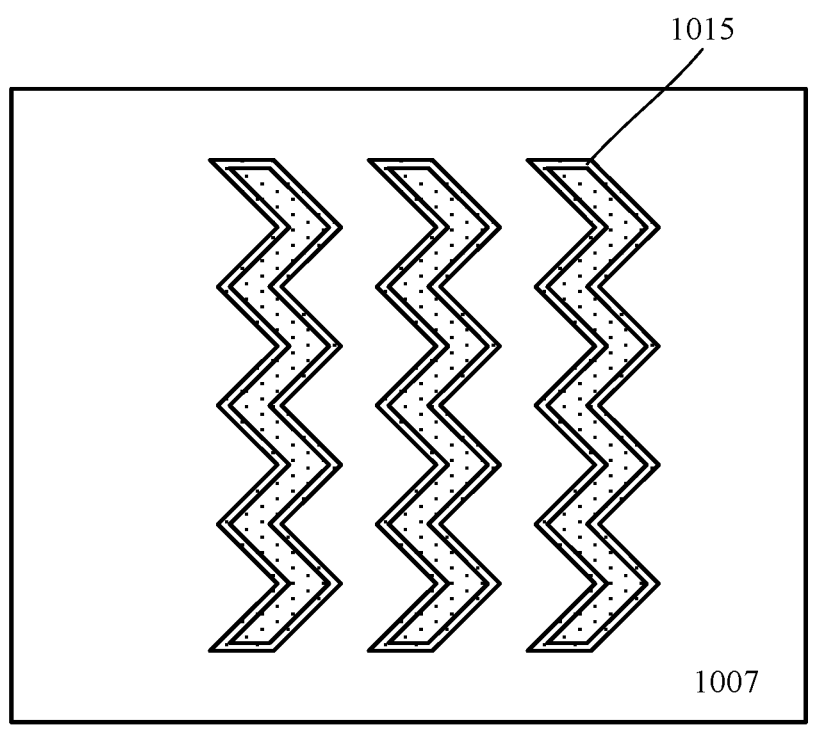
Figure 3B:
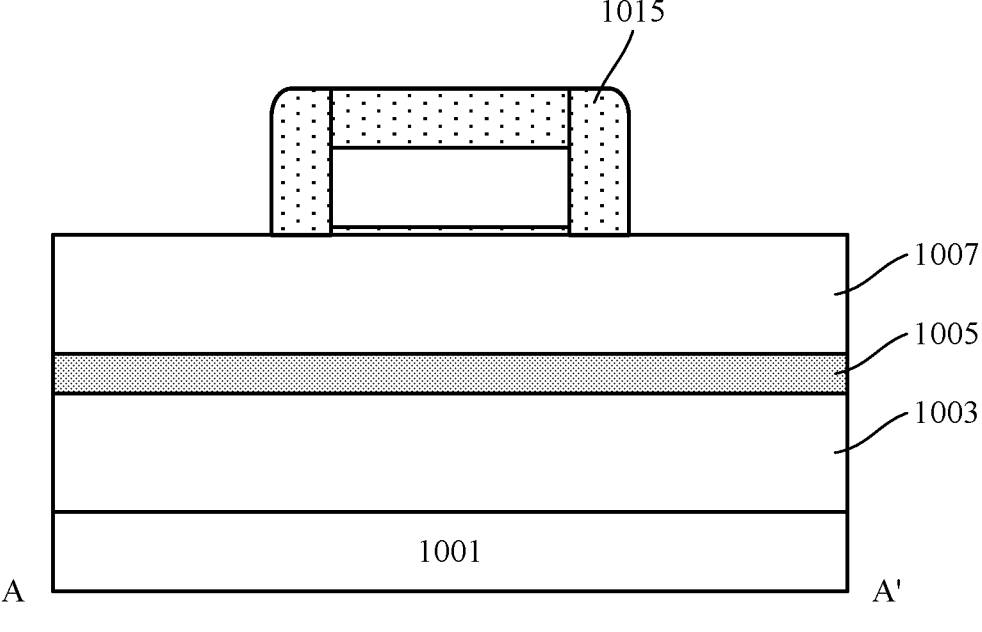

As shown in FIG. 3(*a*) and FIG. 3(*b*), a spacer 1015 may be formed on a sidewall of each strip in the mandrel pattern 1011. For example, a substantially conformal oxide may be deposited, and then an anisotropic etching, such as RIE, may be performed on the deposited oxide layer in the z direction, to remove a lateral extension portion of the deposited oxide layer and retain a vertical extension portion of the deposited oxide layer, so as to obtain the spacer 1015. The spacer 1015 may then be used to define positions of the active region and the bit line (BL) of the device. The spacer 1015 may have a thickness of about 30 nm to 200 nm (in the lateral direction or in a direction perpendicular to the sidewall of the strip).

Figure 4:
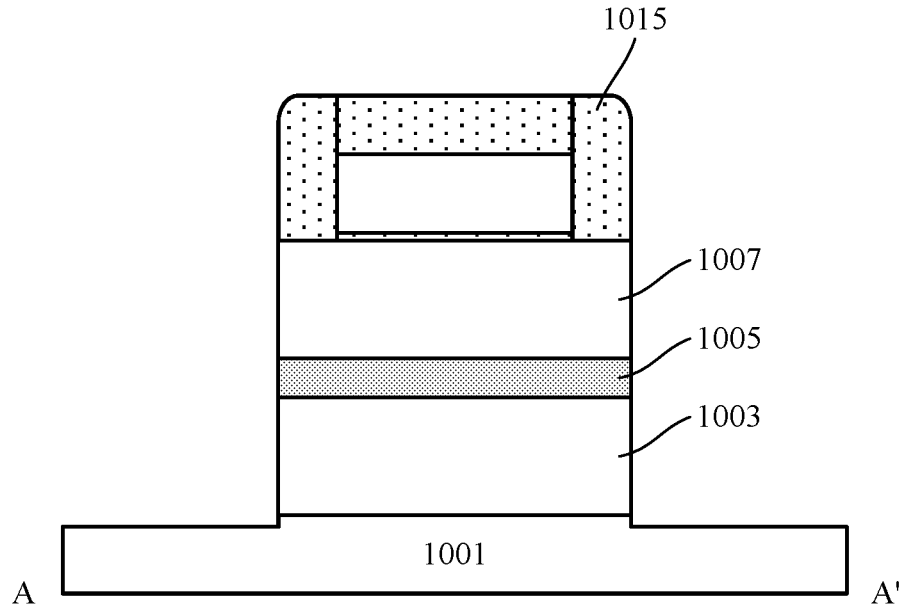

As shown in FIG. 4, the second source/drain layer 1007, the channel defining layer 1005, and the first source/drain layer 1003 may be patterned into a ridge structure corresponding to each strip in the mandrel pattern 1011 by using the hard mask layer 1013 and the spacer 1015. For example, the hard mask layer 1013 and the spacer 1015 may be used as the etching masks to selectively etch each layer sequentially by, for example, RIE in the z direction, so as to transfer the pattern to a lower layer. Here, an over-etching of the substrate 1001 may occur, with an over-etching depth of, for example, about 10 nm to 100 nm.

Figure 5:
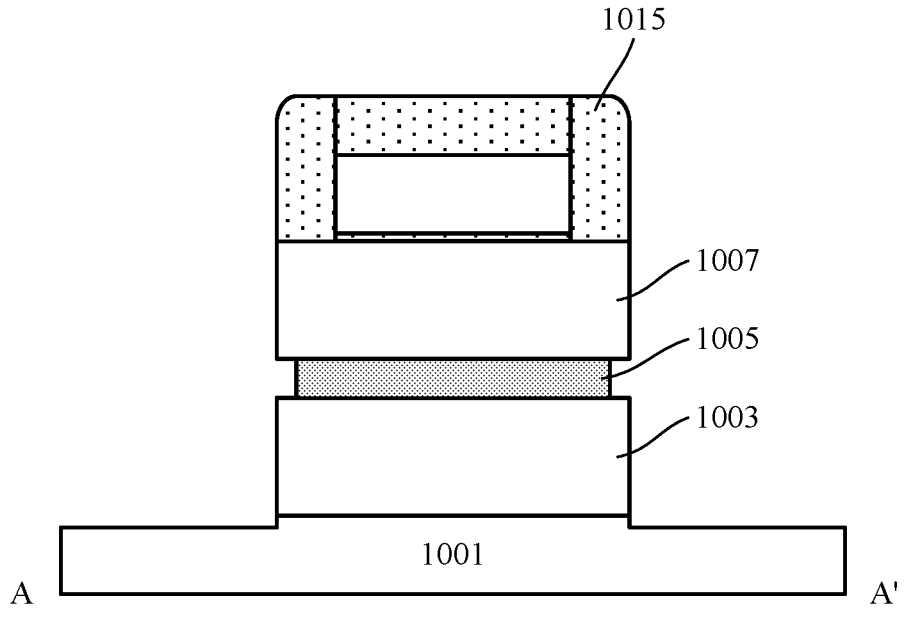

A certain space may be formed between the first source/drain layer 1003 and the second source/drain layer 1007, so that the subsequently formed gate stack may be (at least partially) provided in the space, and the gate stack may be self-aligned to the channel portion defined by the channel defining layer 1005. For example, as shown in FIG. 5, the channel defining layer 1005 may be selectively etched, so that sidewalls of the channel defining layer 1005 may be oppositely recessed in the lateral direction (or in the direction perpendicular to the sidewall of the strip) to form the recess portions. For example, for the selective etching, a mixed gas of $CF_4$, $O_2$, and He with a (volume) ratio of 4:1:5 may be used (which is dry etching), or a mixed solution of HF (an aqueous solution with a concentration of 6%), $H_2O_2$ (an aqueous solution with a concentration of 30%), and $CH_3COOH$ (an aqueous solution with a concentration of 99.8%) with a (volume) ratio of 1:2:4 may be used (which is a wet etching), and a lateral etching amount may be about 10 nm to 100 nm.

In an example of FIG. 5, after the etching, the sidewall of the channel defining layer 1005 remains substantially vertical. Depending on a condition of the etching process, the sidewall of the channel defining layer 1005 after the etching may be in a curved shape, such as a C-shape.

Figure 6:
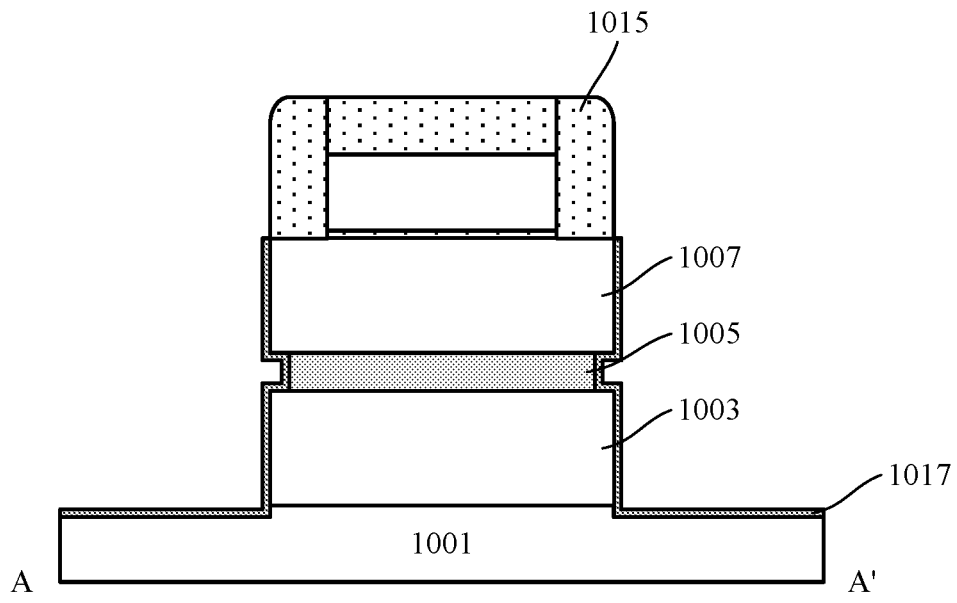

As shown in FIG. 6, an active layer 1017 may be formed on a sidewall of the ridge structure by, for example, a selective epitaxial growth process. Due to the selective epitaxial growth, the active layer 1017 may not be formed on a surface of the hard mask layer 1013 and a surface of the spacer 1015. A portion of the active layer 1017 on the sidewall of the channel defining layer 1005 then faces the gate stack, and thus defines the channel portion. The channel portion extends substantially in the vertical direction, thus the active layer 1017 (especially the portion of active layer 1017 on the sidewall of the channel defining layer 1005) may also be referred to as the (vertical) channel layer. According to the embodiments of the present disclosure, a thickness of the active layer 1017 (defining the channel portion) (in the direction perpendicular to the sidewall of the channel defining layer 1005) may be determined by the epitaxial growth process (for example, the thickness is about 5 nm to 50 nm), thus a thickness of the channel portion may be better controlled.

Although the selective epitaxial growth process is used here, a non-selective epitaxial growth process is also applicable.

A material of the active layer 1017 may be appropriately selected according to the performance requirements of the device during design. For example, the active layer 1017 may include various semiconductor materials, for example, an elemental semiconductor material, such as Si, Ge, etc., or a compound semiconductor material, such as, SiGe, InP, GaAs, InGaAs, etc. In this example, the active layer 1017 may include Si, which is the same as the first source/drain layer and the second source/drain layer.

In addition, the active layer 1017 may be (lightly) doped in situ during its growth, so as to form a certain doping distribution in the channel portion to adjust a threshold voltage (Vt) of the device.

Figure 7:
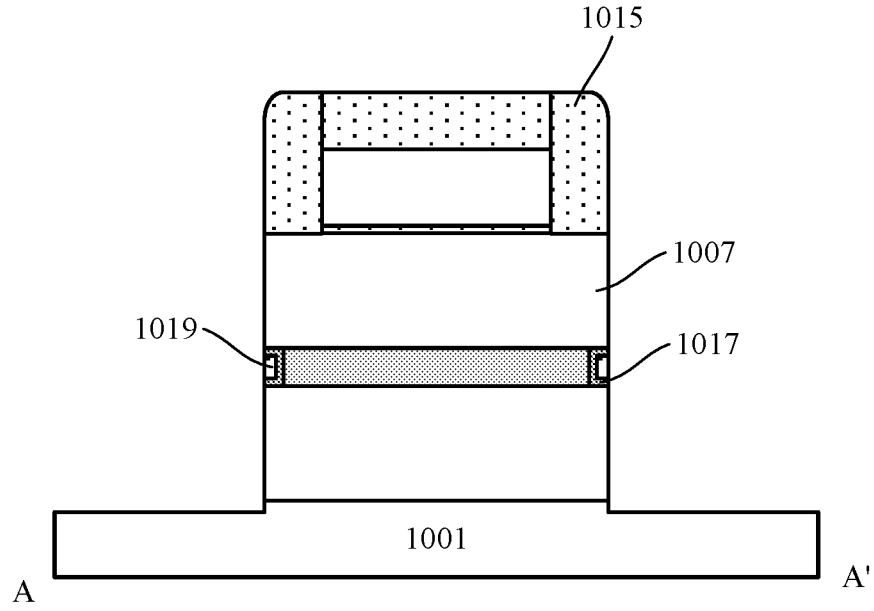

The gate stack may be subsequently formed in the recess portion. In order to prevent unwanted material from being left in the recess portion or affecting the active layer 1017 in a subsequent process, as shown in FIG. 7, a position retaining layer 1019 may be formed in the recess portion. For example, a low-pressure CVD process which provides a good step coverage may be used to deposit a nitride (e.g., silicon nitride) with a thickness of about 10 nm to 100 nm. Then, the hard mask layer 1013 and the spacer 1015 may be used as etching masks to etch back the deposited nitride by, for example, RIE in the z direction, so as to form the position retaining layer 1019 filled in the recess portion. A portion of the active layer 1017 outside the recess portion may also be removed (or may be removed by an additional RIE process).

As a supplement or alternative to the above in-situ doping of the first source/drain layer 1003 and the second source/drain layer 1007, the first source/drain layer 1003 and the second source/drain layer 1007 may be doped to obtain a desired source/drain doping characteristic. The doping may be implemented by using an ion implantation process or a solid-phase dopant source layer. For example, a substantially conformal solid-phase dopant source layer (not shown) may be formed on a structure shown in FIG. 7 by deposition. The solid-phase dopant source layer may be, for example, an oxide including a dopant. For the n-type device, the solid-phase dopant source layer may include an n-type dopant such as PSG (phosphosilicate glass). For the p-type device, the solid-phase dopant source layer may include a p-type dopant such as BSG (borosilicate glass). The dopant in the solid-phase dopant source layer may be driven into the first source/drain layer 1003 and the second source/drain layer 1007 to form the desired source/drain doping characteristic by using an annealing process, such as a laser rapid annealing process at about 700° C. to 1100° C. The dopant may be driven into the first source/drain layer 1003 and the second source/drain layer 1007 mainly along the lateral direction by controlling a condition (e.g., time) of the annealing process (with inhibition of the dopant diffusion from the first source/drain layer 1003 and the second source/drain layer 1007 into the channel portion along the vertical direction). After that, the solid-phase dopant source layer may be removed.

When the in-situ doping during the growth of the first source/drain layer 1003 and the second source/drain layer 1007 meets the performance requirements of the device, an additional doping process may not be required.

Next, the spacer 1015 may be used to define the active region.

Figure 8A:
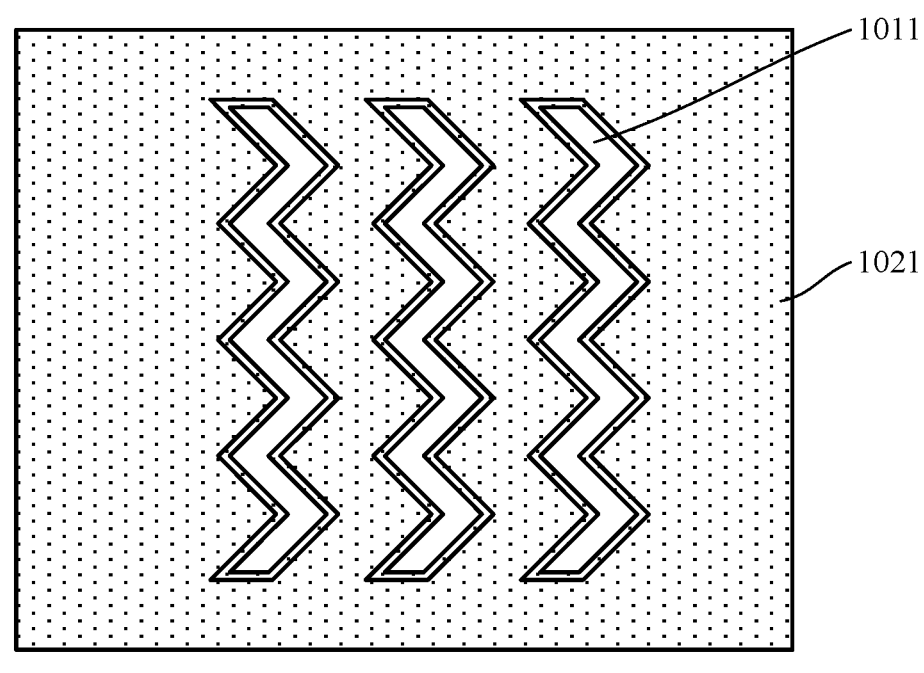
Figure 8B:
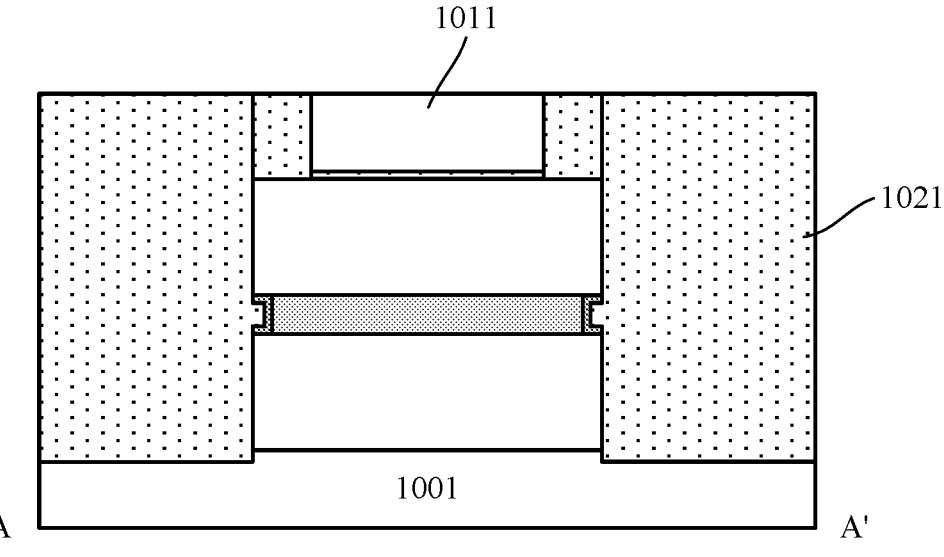

As shown in FIG. 8(*a*) and FIG. 8(*b*), a dielectric layer 1021 may be formed on the substrate 1001. For example, an oxide (e.g., with a thickness of about 300 nm to 1500 nm) which is thick enough to completely cover the ridge structure may be formed by deposition. Then, a planarization process, such as a chemical mechanical polishing (CMP) process, may be performed on the deposited oxide to remove the hard mask layer 1013, so that the mandrel pattern 1011 is exposed. Before the oxide is deposited, the position retaining layer 1019 may also be removed by a selective etching process. Thus, the dielectric layer 1021 may also be filled in the recess portion. The dielectric layer 1021 helps the exposure of the mandrel pattern 1011 through the planarization, and (a part of) the dielectric layer 1021 may also act as an isolation layer in a subsequent process.

In FIG. 8(*a*) and FIG. 8(*b*), in order to clearly show a position of the spacer 1015 (to facilitate an understanding of a region where the active region is located), an interface between the spacer 1015 and the dielectric layer 1021 is still shown. However, in this example, since the spacer 1015 and the dielectric layer 1021 are all oxides, the interface between the spacer 1015 and the dielectric layer 1021 may be vague actually.

Figure 9:
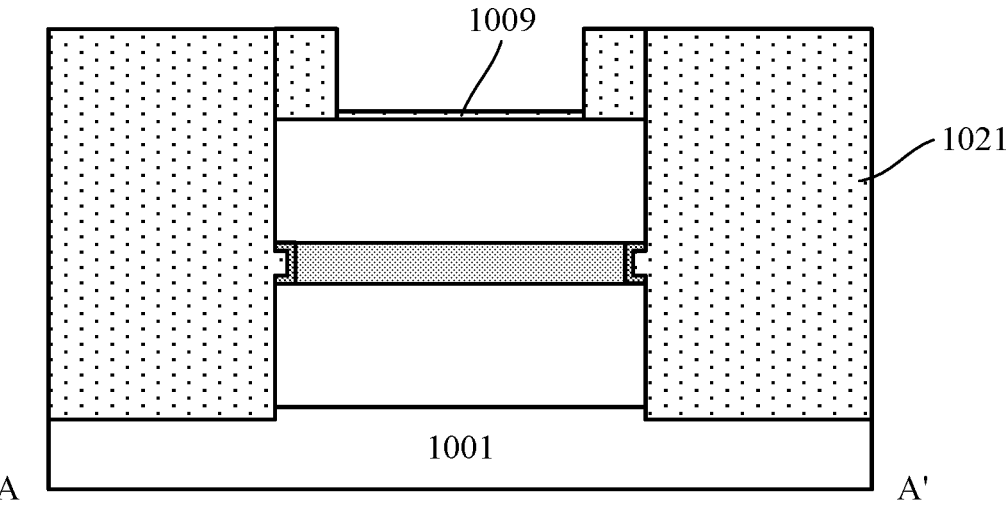

As shown in FIG. 9, the mandrel pattern 1011 may be removed by using a selective etching process, such as a wet etching process using a TMAH (Tetramethylammonium hydroxide) solution (where the etching stops at the etching stop layer 1009). In this way, the spacer 1015 in a shape of a closed loop is formed on the ridge structure.

Figure 10:
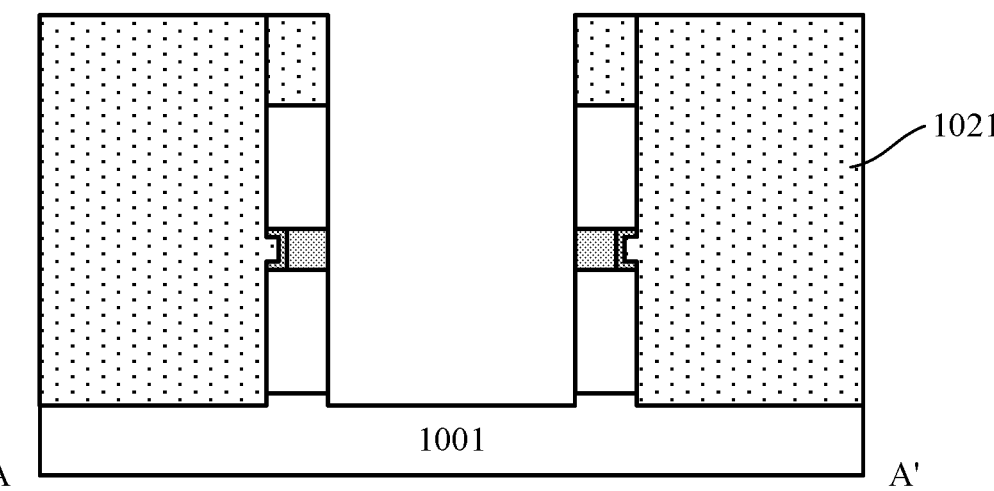

As shown in FIG. 10, the spacer 1015 may be used as an etching mask to selectively etch the etching stop layer 1009, the second source/drain layer 1007, the channel defining layer 1005, and the first source/drain layer 1003 sequentially by, for example, RIE in the z direction. Here, although both the spacer 1015 and the etching stop layer 1009 are oxides, since the etching stop layer 1009 is thin, it is possible to retain the spacer 1015 and remove the etching stop layer 1009. In this way, under the spacer 1015, the first source/drain layer 1003, the channel defining layer 1005, the second source/drain layer 1007, and the active layer 1017 form a closed loop structure corresponding to the spacer 1015, so as to define the active region. Here, likewise, an over-etching of the substrate 1001 may occur, with an over-etching depth of, for example, about 10 nm to 100 nm (the over-etching amounts on inner and outer sides of the spacer 1015 may be substantially the same).

Figure 11:
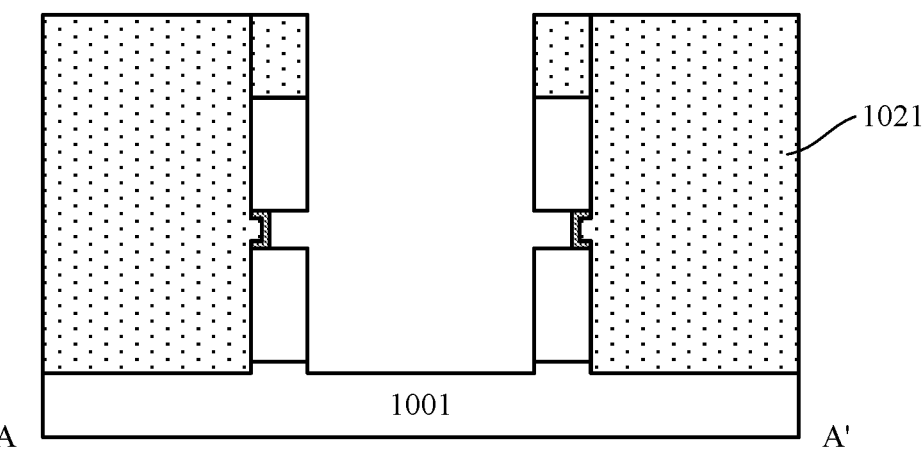

By far, an inner side of the active layer 1017 is covered by the channel defining layer 1005. The channel defining layer 1005 (which is made of SiGe in this example) may be removed by selective etching with respect to the substrate 1001, the first source/drain layer 1003, the active layer 1017, and the second source/drain layer 1007 (which are all made of Si in this example), so as to make room for the gate stack on the inner side of the active layer 1017, as shown in FIG. 11.

Figure 12A:
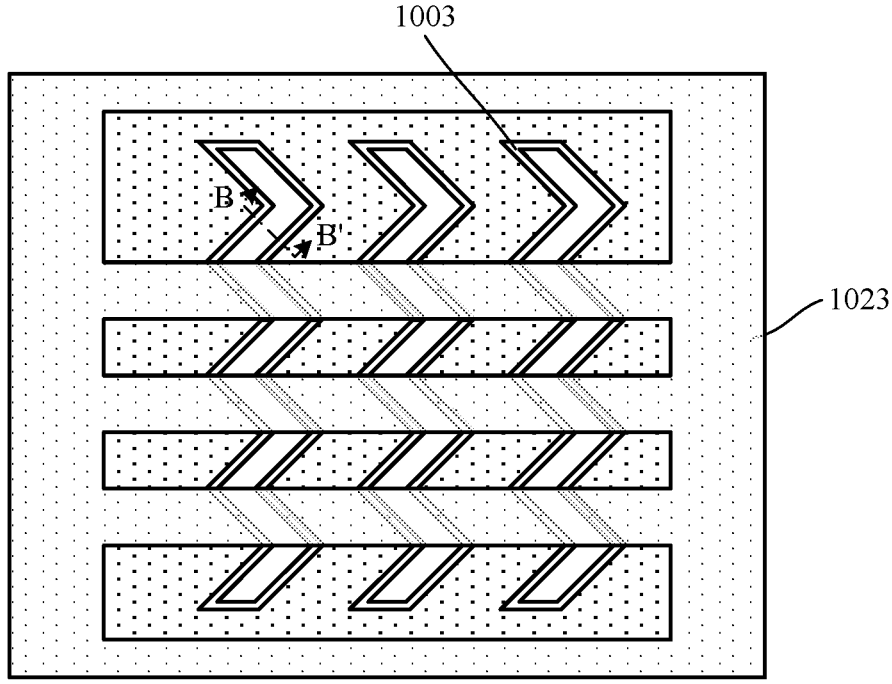
FIG. 12(*c*), FIG. 16(*c*), and FIG. 20(*c*) show sectional views taken along the line BB'.
Figure 12B:
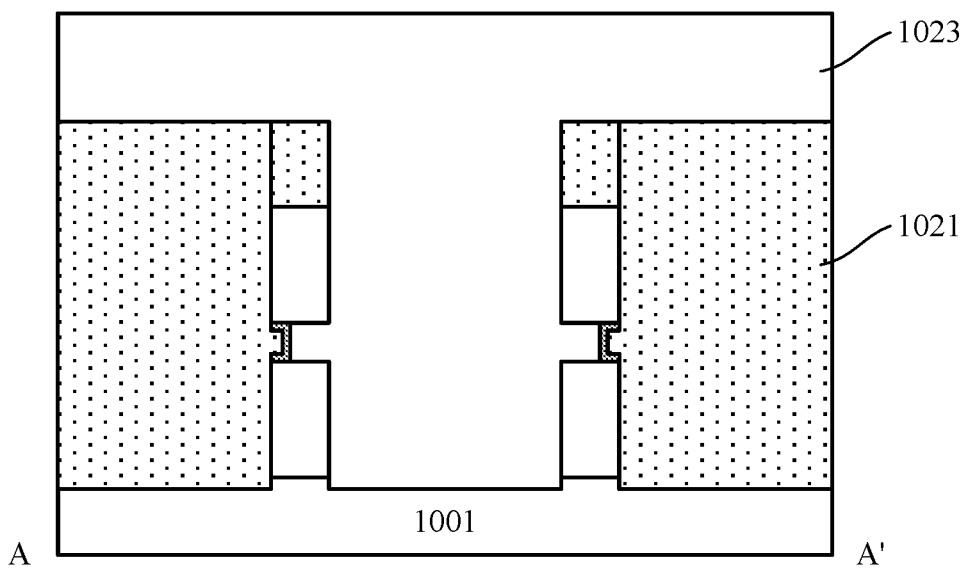
Figure 12C:
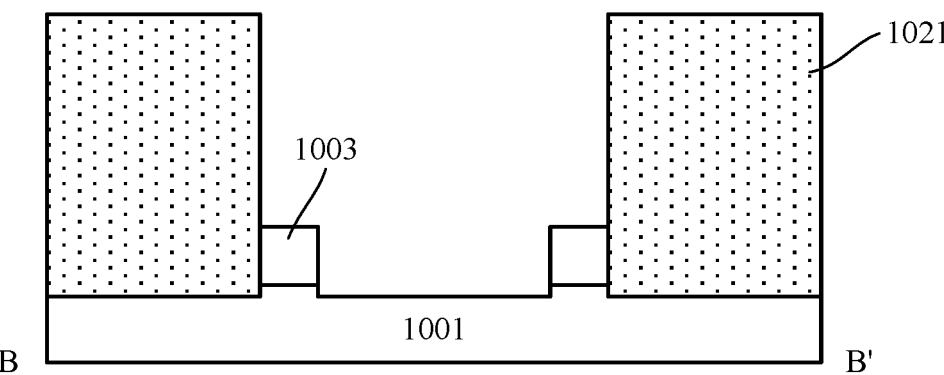

By far, the active region extends continuously in the shape of the closed loop. The continuously extending active region may be divided into active regions corresponding to different devices. For example, as shown in FIG. 12(*a*), FIG. 12(*b*), and FIG. 12(*c*), a photoresist 1023 may be formed on the substrate 1001 and patterned to expose regions between active regions of individual devices by photolithography. For example, the active region of the individual device may be defined based on a segment a of each strip (specifically, based on the spacer on the sidewall of the segment a). In this way, the photoresist 1023 may expose the segment b of each strip (and the spacer on the sidewall of the segment b). In addition, in this example, as shown in a top view of FIG. 12(*a*), the segment a (and the spacer on the sidewall of the segment a) at an (upper) end portion is also exposed in order to prepare for a subsequent process (for example, a treatment for breaking the upper end portion). However, the present disclosure is not limited this. For example, a segment b may be provided at the end portion of each strip, or even in a case where the segment a is provided at the end portion, the segment a at at least one end portion may not be exposed.

The spacer 1015 (and a partial dielectric layer 1021), the second source/drain layer 1007, and the active layer 1017 in a region exposed by an opening in the photoresist 1023 may be removed by a selective etching process, such as RIE in the z direction. In addition, an upper portion of the first source/drain layer 1003 may also be removed. For example, the first source/drain layer 1003 may be etched by about 10% to 50% of its thickness. Here, a lower portion of the first source/drain layer 1003 is retained and may be subsequently used as a continuously extending BL.

In this way, except that (the lower portion of) the first source/drain layer 1003 still extends in the shape of the closed loop, the active layer 1017 and the second source/drain layer 1007 are remained on the two opposite sides of the segment a (except the segment a at the uppermost end) of each strip, forming a series of strip active regions extending in the third direction (combined with the portion of the first source/drain layer 1003 that is below the active layer 1017 and the second source/drain layer 1007). These strip active regions are arranged in an array along the x direction and the y direction.

Figure 13A:
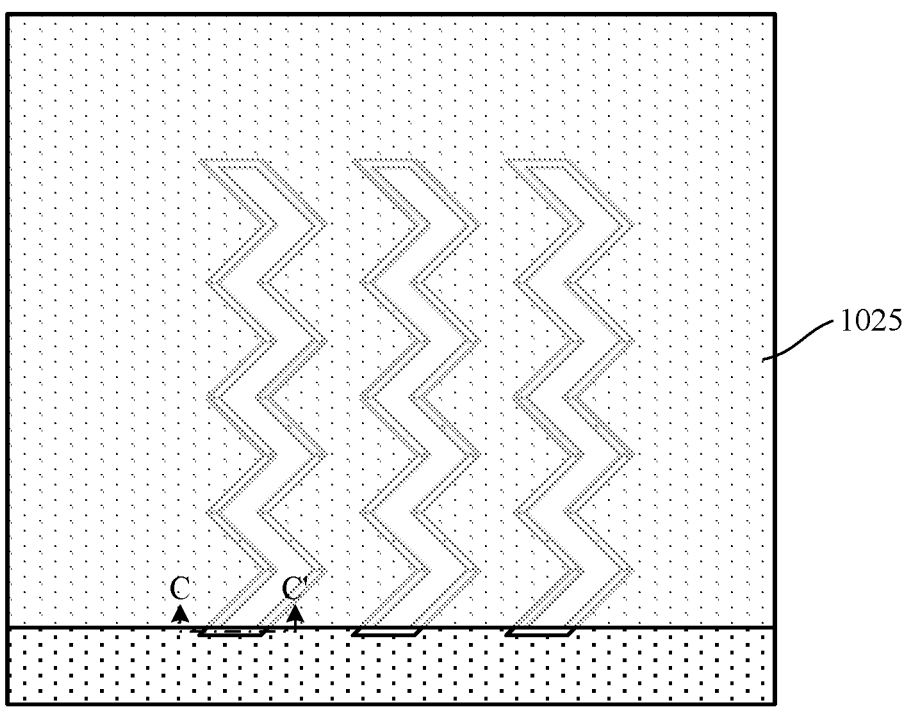
FIG. 13(*b*) shows a section taken along the line CC.
Figure 13B:
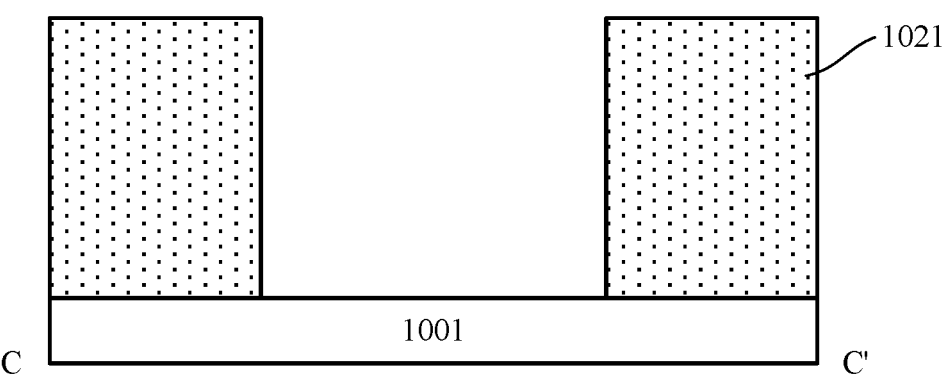

At least one of opposite ends of the first source/drain layer 1003 in the y direction may be broken to form the BL extending in the y direction (in a zigzag shape). For example, as shown in FIG. 13(*a*) and FIG. 13(*b*), a photoresist 1025 may be formed on the substrate 1001 and patterned to expose one end (a lower end in FIG. 13(*a*)) of the first source/drain layer 1003 in the y direction by a photolithography process. The first source/drain layer 1003 in the region exposed by an opening of the photoresist 1025 may be removed by a selective etching process, such as RIE, in the z direction. Similarly, an over-etching of the substrate 1001 may occur, with an over-etching depth of, for example, about 10 nm to 100 nm. In this way, the other end (the upper end in FIG. 13 (*a*)) of the first source/drain layer 1003 in the y direction is still continuous, so that a BL in a folded shape may be formed.

Figure 14:
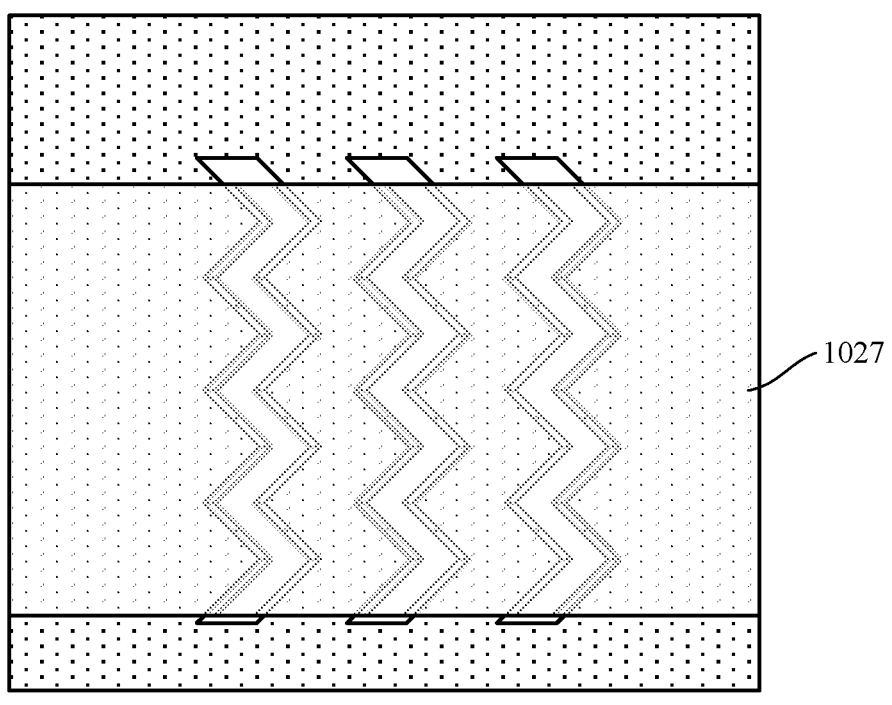

According to another embodiment of the present disclosure, as shown in FIG. 14, instead of the photoresist 1025, a photoresist 1027 may be used to expose the opposite ends of the first source/drain layer 1003 in the y direction. Then, portions of the first source/drain layer 1003 exposed by the photoresist 1025 may be removed. In this way, both ends of the first source/drain layer 1003 in the y direction are broken, so that two BLs (in a zigzag shape) extending in the y direction may be formed. In the processing described above in combination with FIG. 12(*a*), FIG. 12(*b*), and FIG. 12(*c*), exposing the segment a at the upper end is to facilitate the break of the end. If only the lower end is cut off as shown in FIG. 13(*a*) and FIG. 13(*b*), the segment a at the upper end may also be used to define the active region of an individual device.

Figure 15:
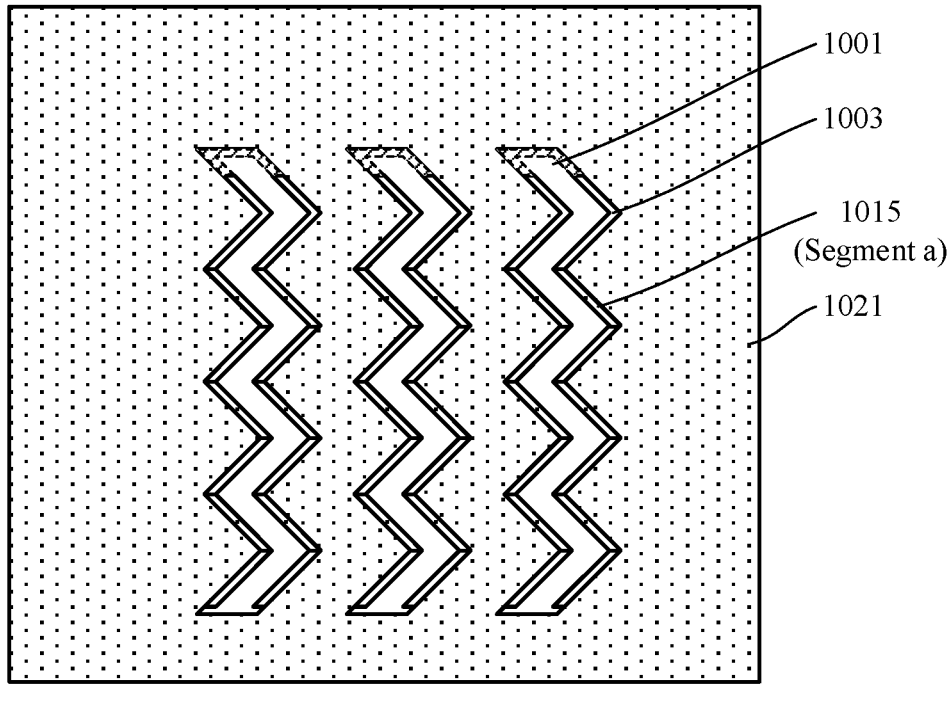

FIG. 15 shows a shape of the current active region. As shown in FIG. 15, the active region of an individual device is defined by the segment a of the spacer 1015. The active regions of the respective individual devices extend in the third direction between the x direction and the y direction, and are arranged in a row along the x direction and in a column along the y direction, so as to form a (two-dimensional) array. The active region of each individual device includes a vertical stack which is below the corresponding segment a of the spacer 1015 and is formed of the first source/drain layer 1003, the channel layer 1017, and the second source/drain layer 1007. The first source/drain layers in the active regions of the respective devices in the same column extend continuously in the y direction (in a zigzag shape), and thus may form the BL that is self-aligned to the active regions of the respective devices. Alternatively, as shown by a dotted line at the upper end portion in FIG. 15, in a case of performing an etching by using the photoresist 1025 shown in FIG. 13(*a*), each pair of adjacent columns in the x direction may be connected with each other at their end portions, so that a BL in a folded shape may be formed. The following description is made for the case described in combination with FIG. 14, however, the description is also applicable to the case described in combination with FIG. 13.

A switching device may be manufactured based on such active region, and a storage unit (e.g., a switching device plus a data storage structure) may be formed based on each switching device.

Figure 16A:
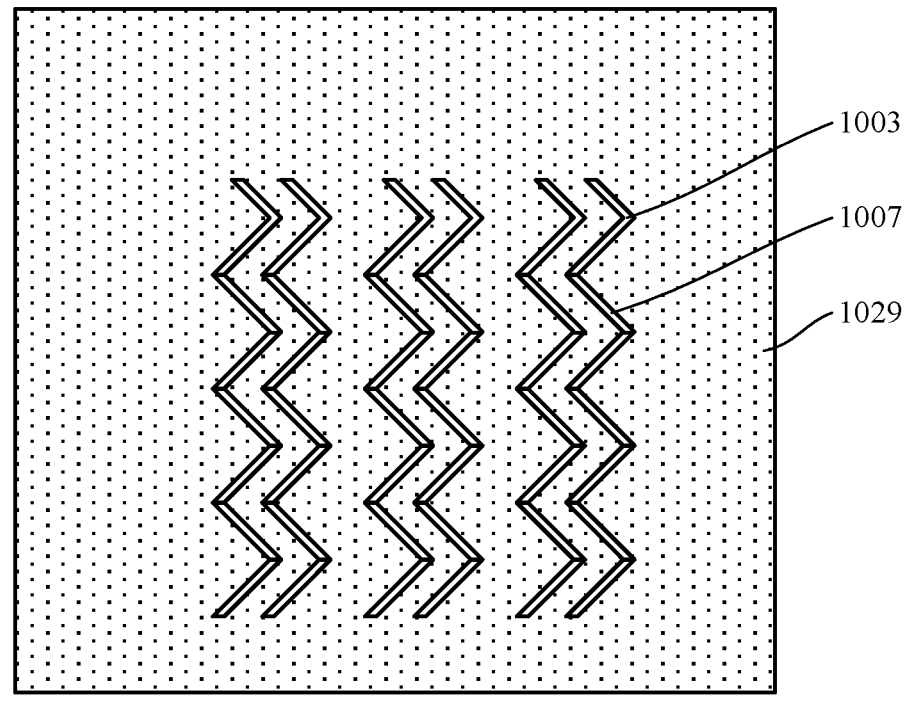
Figure 16B:
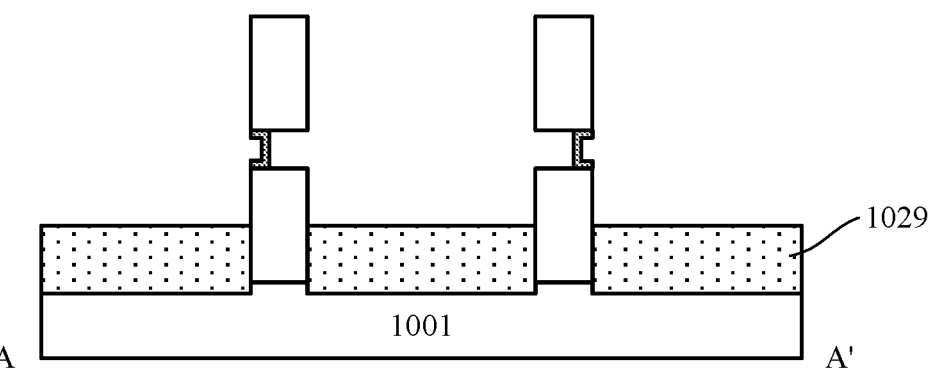
Figure 16C:
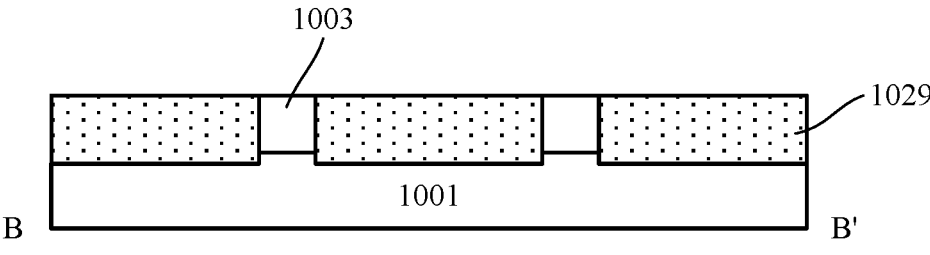

An isolation layer for electrical isolation may be formed on the substrate. For example, as shown in FIG. 16(*a*), FIG. 16(*b*) and FIG. 16(*c*), an oxide thick enough (e.g., with a thickness of about 300 nm to 1500 nm) to cover the active region may be formed on the substrate by deposition such as CVD. Then, a planarization process such as CMP may be performed on the deposited oxide. By wet etching (for example, by using HF acid) or dry etching, the oxide after the planarization process (and the previously formed spacer 1015 and dielectric layer 1021 which are also oxides) may be etched back, so that the remaining oxide with a certain thickness on the substrate 1001 serves as an isolation layer 1029. For example, a top surface of the isolation layer 1029 may be at about 10 nm to 150 nm below a bottom of the channel portion (or a top surface of the first source/drain layer 1003).

In FIG. 16(*c*), the top surface of the first source/drain layer 1003 extending outside the active regions of each device is shown to be flush with the top surface of the isolation layer 1029. However, this is only shown schematically for the convenience of illustration. Depending on an etching amount, the top surface of the first source/drain layer 1003 may be protruding or recessed with respect to the top surface of the isolation layer 1029.

A gate stack may be formed on the isolation layer 1029. According to the embodiments of the present disclosure, the gate stack may be formed together with the WL to simplify the process steps, thereby reducing the costs.

Figure 17:
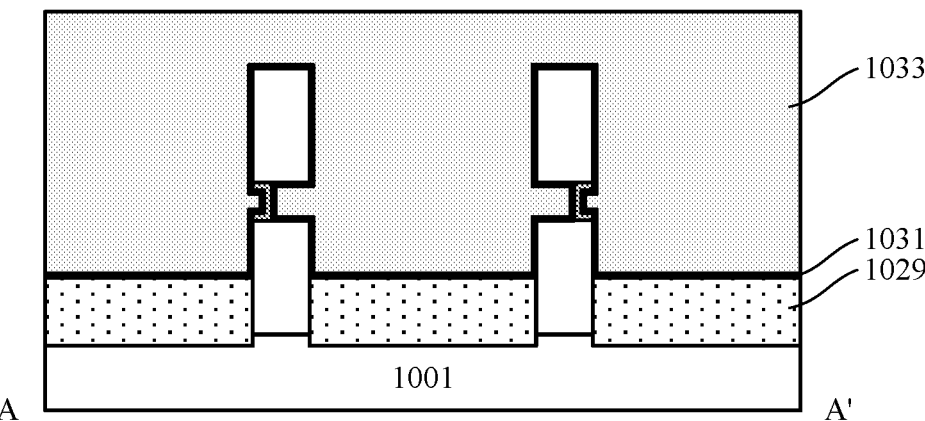

For example, as shown in FIG. 17, a substantially conformal gate dielectric layer 1031 may be formed on the isolation layer 1029 by deposition, and a gate conductor layer 1033 may be formed on the gate dielectric layer 1031. For example, the gate dielectric layer 1031 may include a high-k gate dielectric such as $HfO_2$, with a thickness of, for example, about 1 nm to 10 nm. Before forming the high-k gate dielectric, an interface layer may also be formed, such as an oxide formed by an oxidation process, or a deposition process such as atomic layer deposition (ALD). The gate conductor layer 1033 may include a work function adjustment metal such as TiN, with a thickness of, for example, about 1 nm to 10 nm, and a gate conductive metal with a thickness of, for example, about 100 nm to 800 nm, such as W, etc. A planarization process such as CMP may be performed on the gate conductor layer 1033, which may fill the space between the active regions of the respective devices. The gate stack (namely the gate dielectric layer 1031 plus the gate conductor layer 1033) formed in this way may be embedded between the first source/drain layer 1003 and the second source/drain layer 1007, and may surround the channel layer 1017.

Figure 18A:
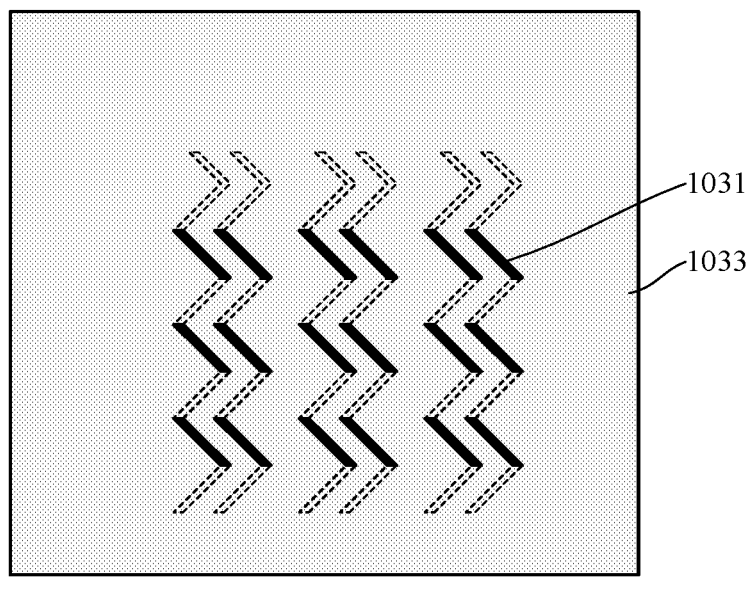
Figure 18B:
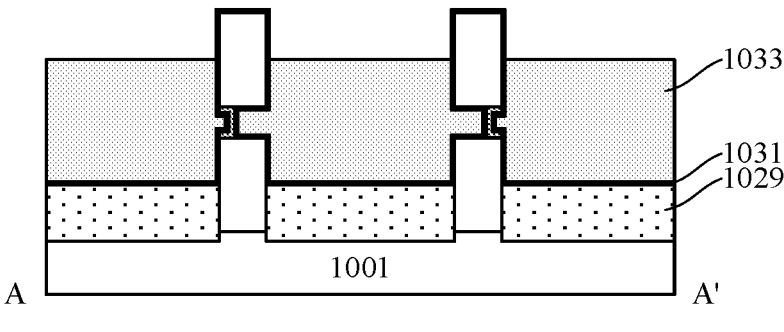

In order to reduce a parasitic capacitance, for example, as shown in FIG. 18(*a*) and FIG. 18(*b*), the gate conductor layer 1033 may be etched back by, for example, RIE in the z direction, to reduce an overlap between the gate conductor layer 1033 and the second source/drain layer 1007. Here, a top surface of the gate conductor layer 1033 after being etched back may be higher than a top surface of the channel layer 1017 or a bottom surface of the second source/drain layer 1007, so that the gate conductor layer 1033 may cover an entire height of the channel layer 1017. For example, the top surface of the gate conductor layer 1033 after being etched back may be located at a position between about 30% and 70% of a height of the second source/drain layer 1007 in the vertical direction.

The WL may be formed based on the gate stack, in particular the gate conductor layer 1033 therein.

Figure 19:
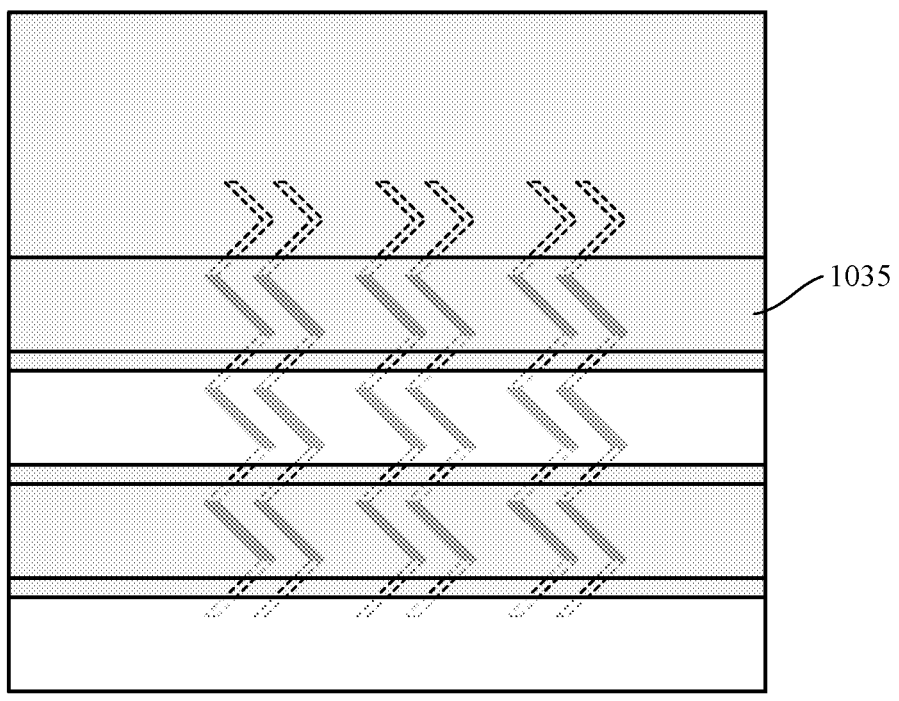

For example, as shown in FIG. 19, a photoresist 1035 may be formed on the gate conductor layer 1033 and patterned into a pattern corresponding to the WL (in this example, a series of strips extending in the x direction are taken as an example) by photolithography (where the minimum dimension of the layout CD may be about 10 nm to 50 nm). The strips may extend in the x direction and intersect with active regions of devices in each row. Here, each strip is wide enough in the y direction to completely cover an active region of each device in the row corresponding to the strip. More specifically, a span of the active regions of the devices in the y direction in each row may be within a width of the strip corresponding to the row in the y direction, so that the subsequently formed WL may electrically connect gate stacks on inner and outer side of the channel layer 1017 to each other.

Figure 20A:
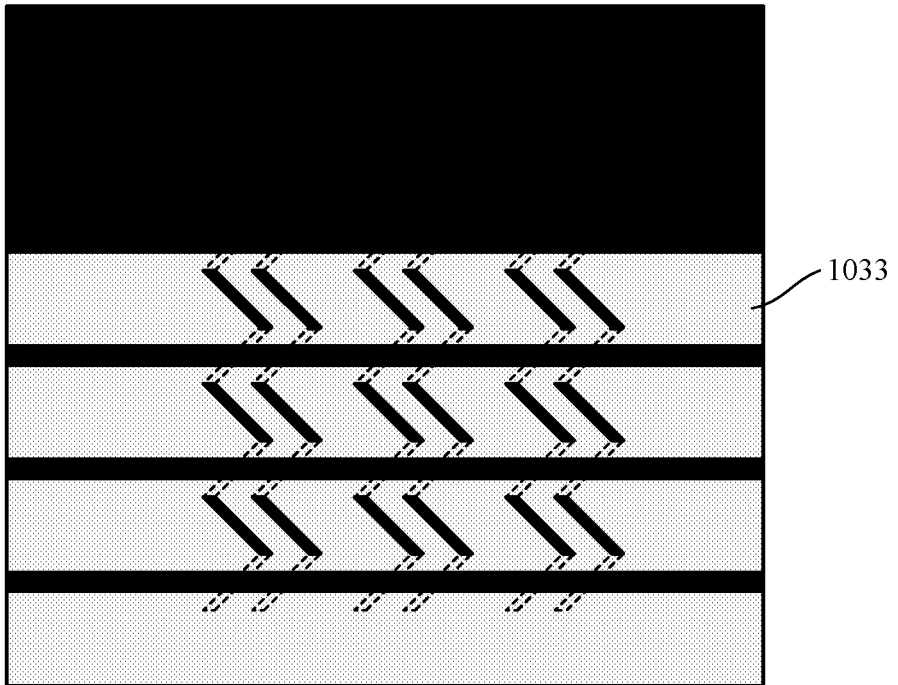
Figure 20B:
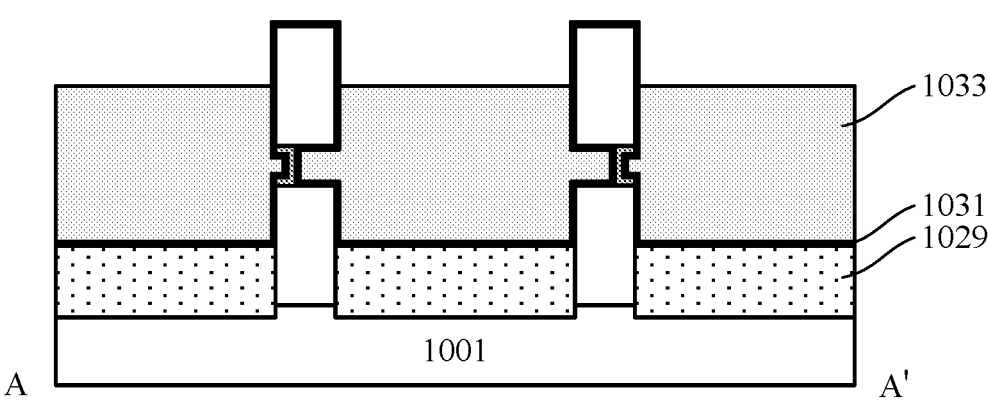
Figure 20C:
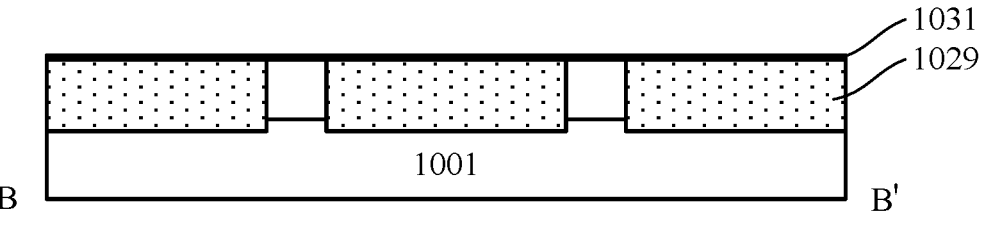

As shown in FIG. 20(*a*), FIG. 20(*b*) and FIG. 20(*c*), the gate conductor layer 1033 may be selectively etched by, for example, RIE in the z direction using the photoresist 1035 as the etching mask, so as to pattern the gate conductor layer 1033 into the WL corresponding to the pattern of the photoresist 1035. The etching may stop at the gate dielectric layer 1031. As shown in FIG. 20(*b*), the gate conductor layer 1033 may be retained in a gap between the first source/drain layer 1003 and the second source/drain layer 1007, and therefore may be disposed on the inner and outer sides of the channel layer 1017 in a self-aligned manner. In addition, as described above, the gate conductor layer 1033 may also surround the channel layer 1017 on two opposite sides of the channel layer 1017 in the y direction. Then, the gate-all-around configuration may be obtained.

The WL is not limited to being formed in the manner described above. For example, instead of performing the above etching back process of the gate conductor layer in combination with FIG. 18(*a*) and FIG. 18(*b*), the gate conductor layer that has not been etched back may be patterned as a WL in the x direction. Each WL may extend in the x direction to intersect a portion of the active region of each device in the y direction in the row corresponding to the WL (instead of with the width completely covering the active region of each device as described above). In this way, the gate conductor layer 1033 may be retained in the gap between the first source/drain layer 1003 and the second source/drain layer 1007, and therefore may be disposed on the inner and outer sides of the channel layer 1017 in a self-aligned manner, so as to form the double-gate configuration. In addition, at the WL, the top surface of the gate conductor layer 1033 is higher than the top surface of the active region of the device (i.e., the top surface of the second source/drain layer 1007), so that gate stacks on the inner and outer sides of the channel layer 1017 may be electrically connected to each other.

Although the WL is formed with the gate conductor layer here, the present disclosure is not limited this. For example, the gate conductor layer 1033 may be selectively etched, such as by RIE in the z direction, without an additional formation of an etching mask. In this way, the gate conductor layer 1033 may be retained in the gap between the first source/drain layer 1003 and the second source/drain layer 1007. Then, a conductive layer may be additionally formed and patterned into a WL (by using, for example, the photoresist 1035).

As shown in FIG. 20(*a*), FIG. 20(*b*), and FIG. 20(*c*), the storage unit may include the first source/drain layer 1003, the channel layer 1017, and the second source/drain layer 1007 that are sequentially stacked in the vertical direction. The channel layer 1017 may be in a shape of a nanosheet or a nanowire. The gate stack is between the first source/drain layer 1003 and the second source/drain layer 1007 in the vertical direction, and sandwiches the channel layer 1017 from the two opposite sides of the channel layer 1017, or even surrounds the channel layer 1017. The active region (namely the stack of the first source/drain layer 1003, the channel layer 1017, and the second source/drain layer 1007), especially the channel layer 1017 therein, may extend in the third direction inclined with respect to the y direction (or the x direction), so that the channel width may be increased and therefore the on-current may be increased.

Figure 21A:
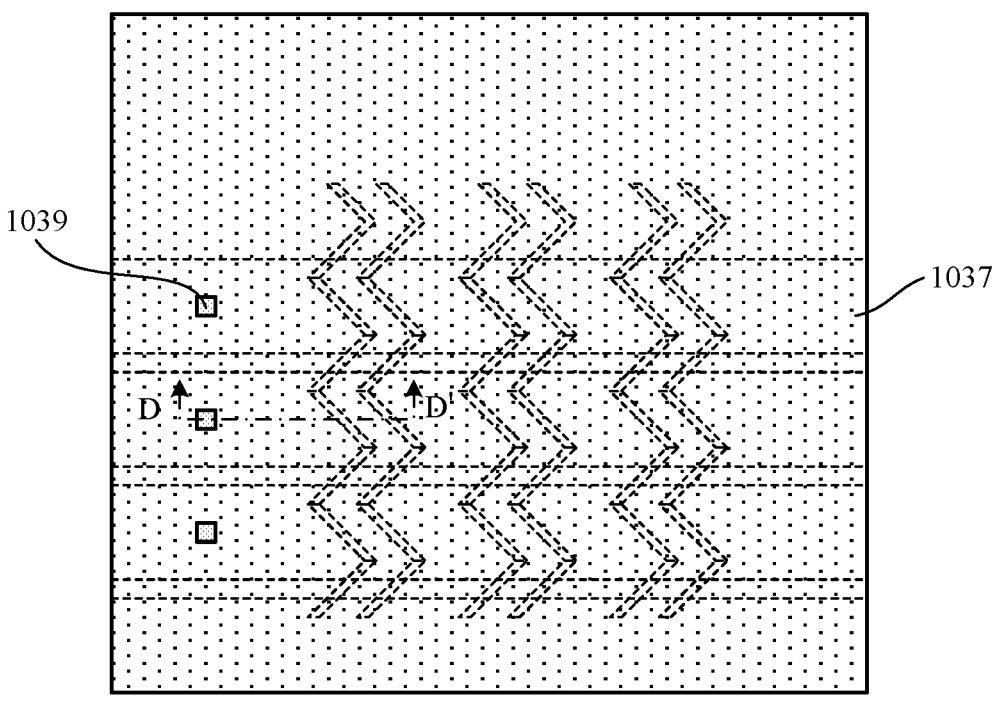
FIG. 21(*b*) and FIG. 24(*b*) show sections taken along the line DD'.
Figure 21B:
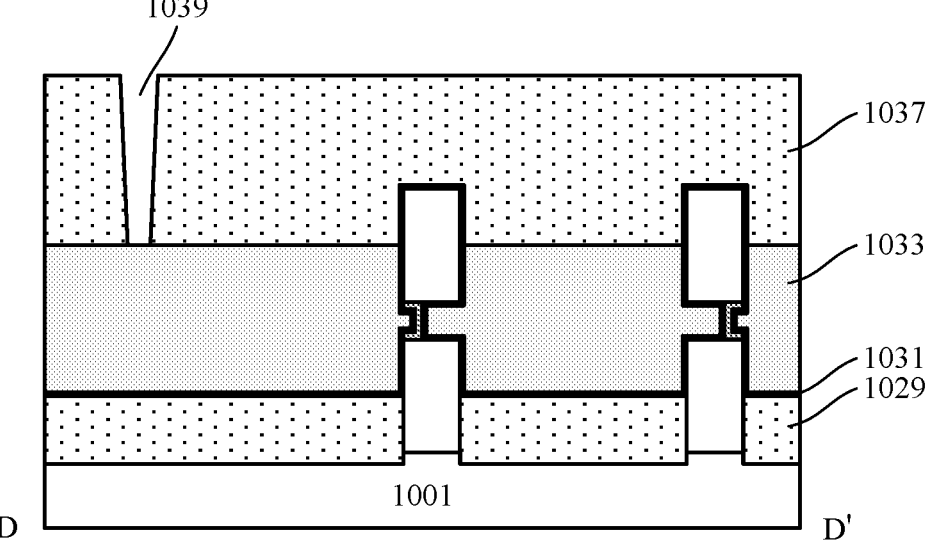

As shown in FIG. 21(*a*) and FIG. 21(*b*), an interlayer dielectric layer 1037 may be formed on the isolation layer 1029. For example, an oxide of about 50 nm to 100 nm may be deposited, for example, by CVD, and a planarization process such as CMP may be performed on the deposited oxide to form the interlayer dielectric layer 1037. Before forming the oxide interlayer dielectric layer 1037, a nitride liner (not shown) with a thickness of, for example, about 10 nm to 30 nm may be formed. In the interlayer dielectric layer 1037, a WL contact hole 1039 may be formed by a photolithography process. As shown in FIG. 21(*a*), the WL contact hole 1039 may be provided at each WL to expose the gate conductor layer 1033 used as the WL.

Figure 22A:
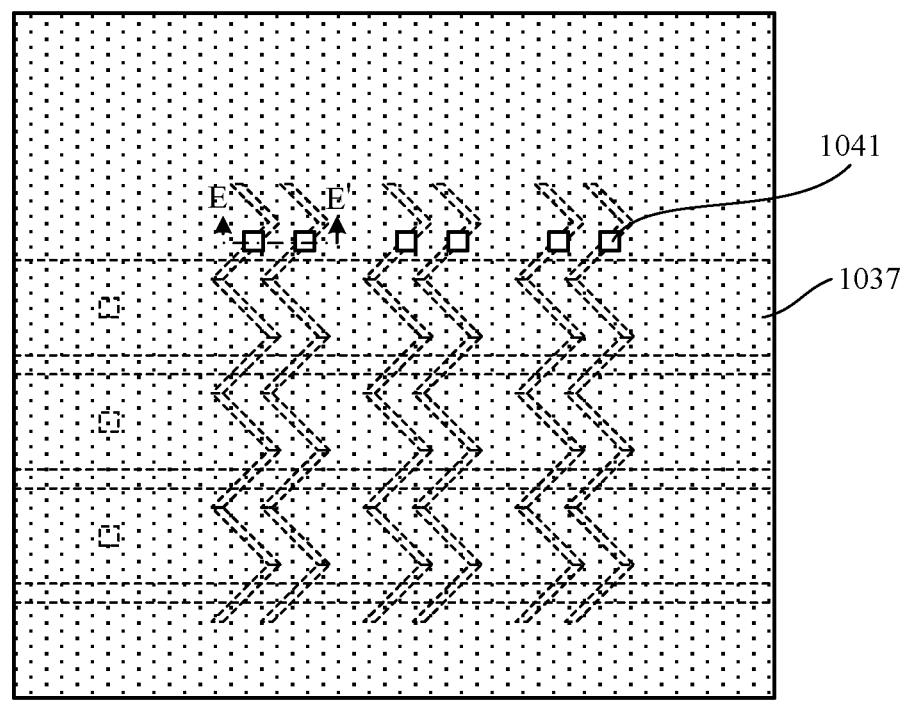
FIG. 22(*b*) and FIG. 24(*c*) show sections taken along the line EE'.
Figure 22B:
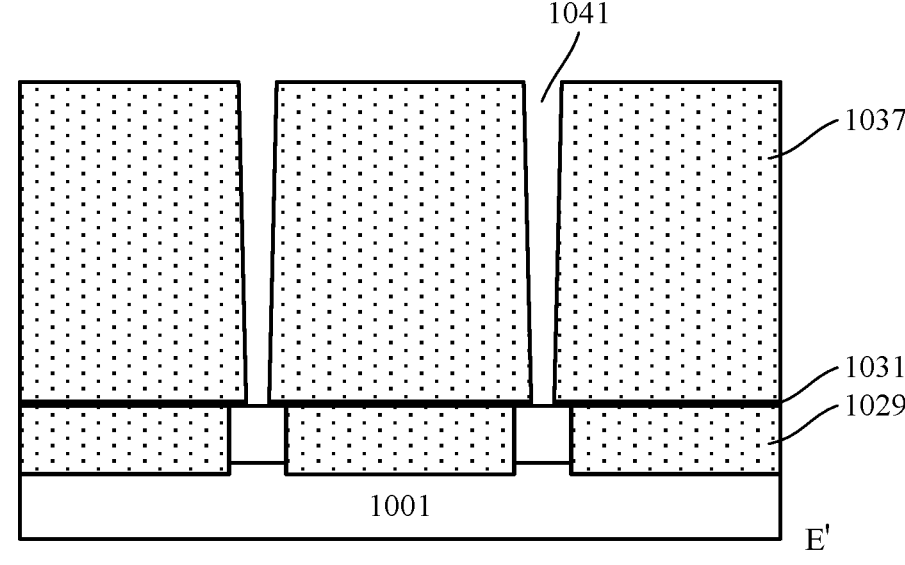

In addition, as shown in FIG. 22(*a*) and FIG. 22(*b*), in the interlayer dielectric layer 1037, a BL contact hole 1041 may be formed by a photolithography process. The BL contact hole 1041 may be provided at each BL to expose the first source/drain layer 1003 used as the BL.

Figure 23A:
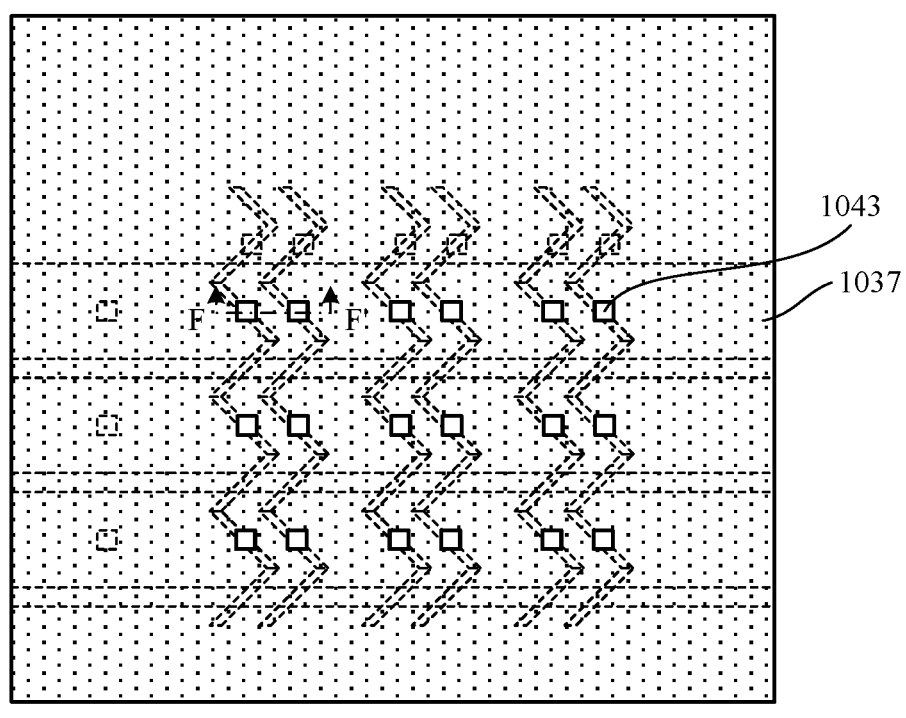
FIG. 23(*b*) and FIG. 24(*d*) show sections taken along the line FF'.
Figure 23B:
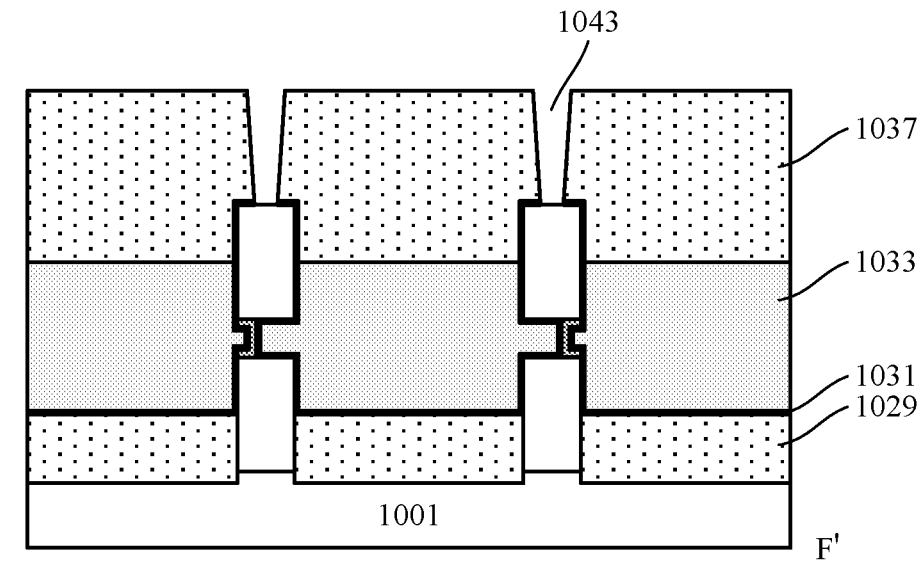
Figure 24A:
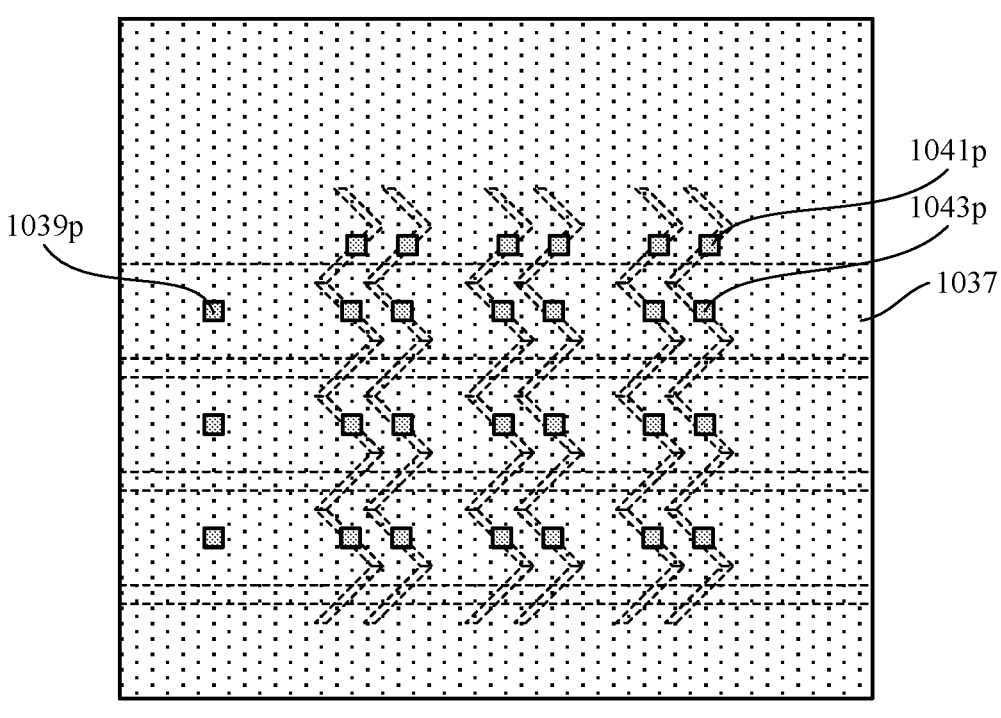
Figure 24B:
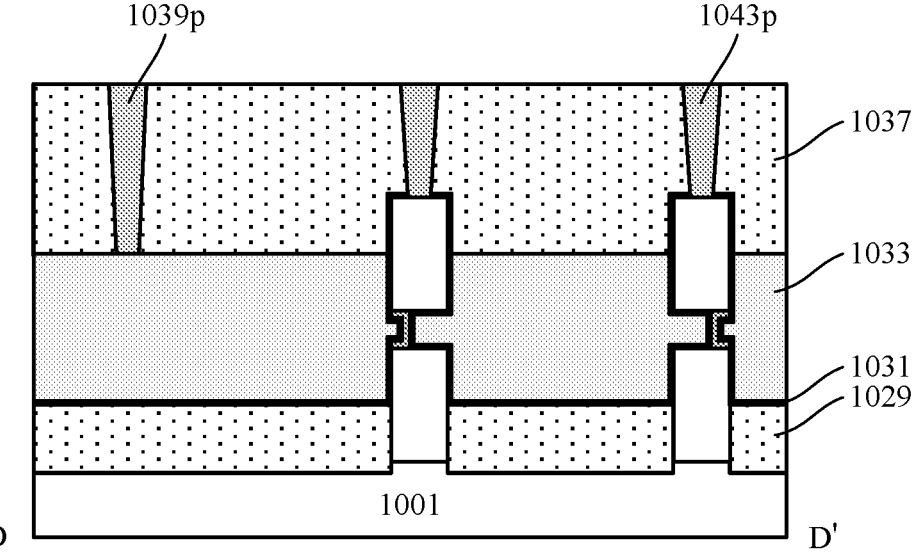
Figure 24C:
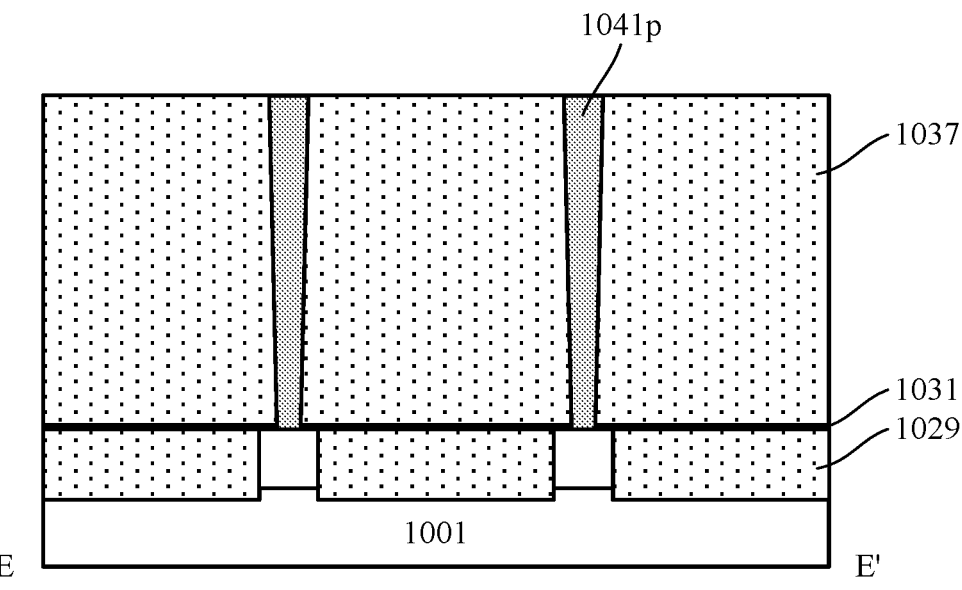
Figure 24D:
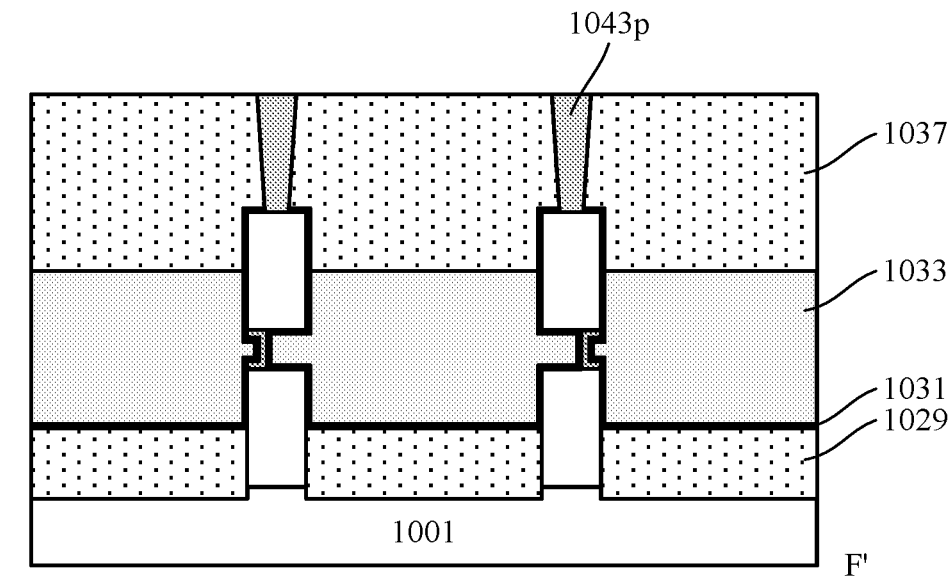

In addition, as shown in FIG. 23(*a*) and FIG. 23(*b*), in the interlayer dielectric layer 1037, a capacitor contact hole 1043 may be formed by a photolithography process. The capacitor contact hole 1043 may be provided at the active region of each device (corresponding to the spacer on the sidewall of each segment a described above) to expose the second source/drain layer 1007.

Note that the above etchings on the interlayer dielectric layer 1037 for forming the BL contact hole, the capacitive contact hole, and the WL contact hole are performed respectively, since their respective etching depths are different. The process order may be different from the process order described above.

Then, as shown in FIG. 24(*a*), FIG. 24(*b*), FIG. 24(*c*) and FIG. 24(*d*), a WL contact plug 1039*p*, a BL contact plug 1041*p*, and a capacitor contact plug 1043*p* may be respectively formed in the WL contact hole 1039, the BL contact hole 1041, and the capacitive contact hole 1043 by, for example, depositing a conductive material.

Figure 25A:
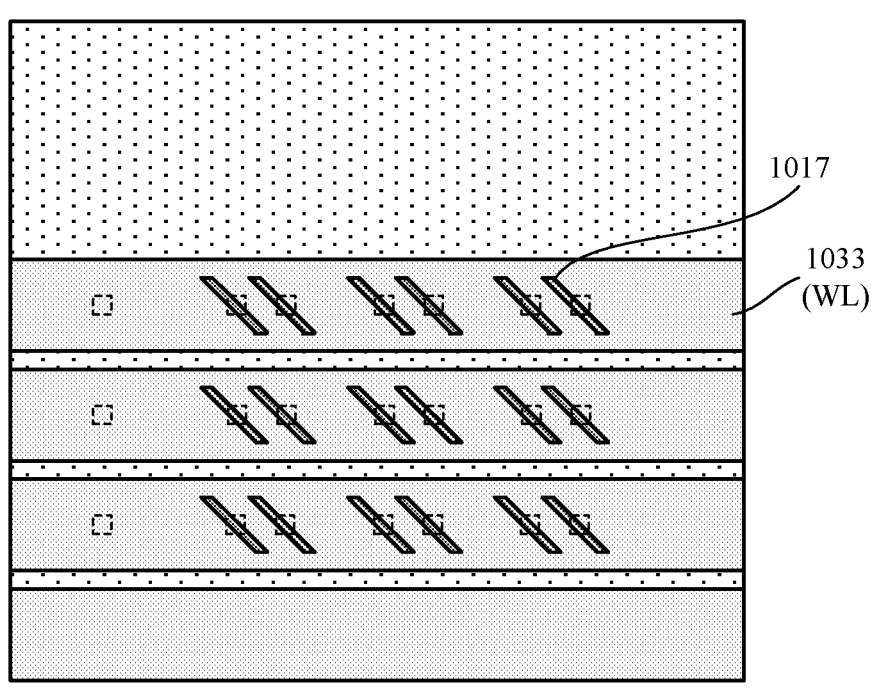
FIG. 25 (*a*) schematically shows a layout of a channel layer and a word line in a storage device according to an embodiment of the present disclosure.
Figure 25B:
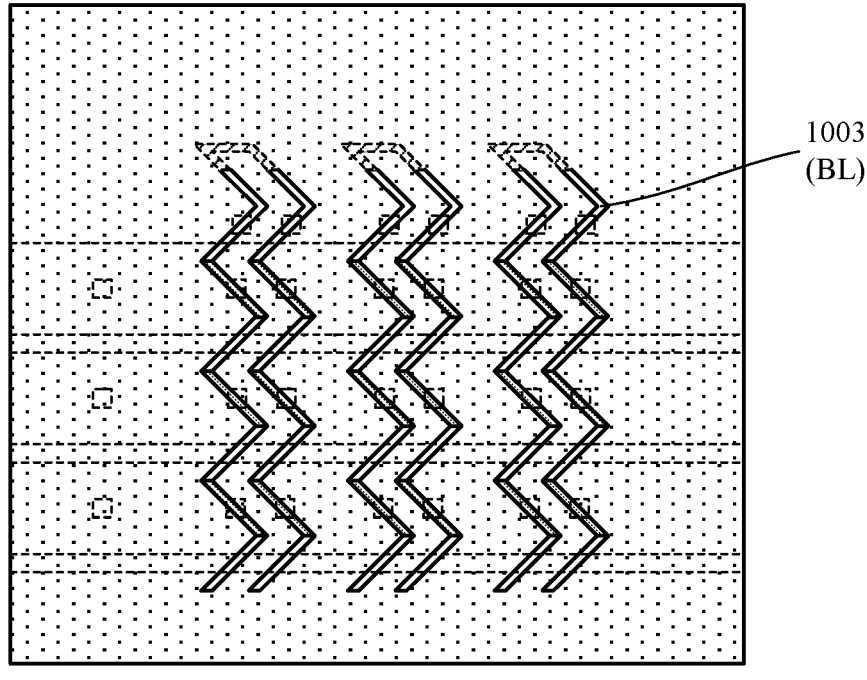

FIG. 25(*a*) shows a sectional view obtained by cutting the storage device parallel to an x-y plane at an approximately middle portion of the channel layer 1017 in the vertical direction. The sectional view shows a relationship between the gate stack (where the gate dielectric layer is not shown for clarity) and the channel layer 1017. As clearly shown in FIG. 25(*a*), the gate stack may surround the channel layer 1017. In addition, positions of the WL contact plug and the capacitor contact plug are also shown in the FIG. 25(*a*) by dotted boxes.

FIG. 25(*b*) shows a sectional view obtained by cutting the storage device parallel to an x-y plane at a lower portion of the first source/drain layer 1003 in the vertical direction. The sectional view clearly shows the BL. It will be noted that the BL continuously extends in the y direction (in a zigzag shape). In FIG. 25(*b*), positions of the BL corresponding to the storage units is shown with shadows, only for convenience of understanding of the position of the storage unit. In fact, here the BL is the first source/drain layer 1003 that extends integrally. As described above, the BL may also be in a folded shape, as shown by a dotted line at the end portion of the BL in FIG. 25(*b*). In addition, positions of the WL contact plug, the BL contact plug, and the capacitor contact plug are further shown by dotted boxes.

Subsequently, a later stage process may be performed, which will not be repeated here.

The storage device according to the embodiments of the present disclosure may be applied to various electronic apparatuses. For example, the electronic apparatus may include a storage device and a processor. The storage device may store data required for an operation of the electronic apparatus or data obtained during an operation. The processor may operate based on data and/or applications stored in the storage device. The electronic apparatus may include, for example, a smart phone, a personal computer (PC), a tablet computer, a wearable intelligence device, an artificial intelligence device, a portable power source, and so on.

In the above description, patterning, etching and other technical details of each layer may not be described in detail, however, those skilled in the art should understand that various technical means may be used to form layers, regions, etc. of desired shapes. In addition, in order to form the same structure, those skilled in the art may further design a method that is not completely the same as the method described above. In addition, although the various embodiments are described above separately, this does not mean that the steps in the various embodiments may not be advantageously used in combination.

The embodiments of the present disclosure have been described above. However, these embodiments are for illustration only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A storage device, comprising:
a substrate;
a storage unit array disposed on the substrate, wherein the storage unit array comprises a plurality of storage units arranged in a row along a first direction and a column along a second direction intersecting the first direction, and each of the storage units comprises:
an active region extending in a third direction different from the first direction and the second direction, wherein the active region comprises a vertical stack of a first source/drain layer, a channel layer, and a second source/drain layer; and
a gate stack disposed between the first source/drain layer and the second source/drain layer in a vertical direction and sandwiching the channel layer from at least two opposite sides of the channel layer; and
a plurality of word lines extending in the first direction on the substrate;
wherein the first source/drain layers in the active regions of each column of storage units are continuous, so as to form a bit line continuously extending in the second direction in a zigzag shape, and
wherein each of the word lines extends in the first direction to intersect each of the active regions of a respective row of storage units, and is electrically connected to the gate stack of each storage unit on first and second opposite sides of the channel layer of the storage unit.

2. The storage device according to claim 1, wherein the third direction is at an angle of about 30 degrees to 80 degrees with respect to the second direction.

3. The storage device according to claim 1, wherein the third direction is along a specific crystal face.

4. The storage device according to claim 3, wherein the crystal face comprises a (100) crystal face.

5. The storage device according to claim 1, wherein the gate stack comprises a gate dielectric layer, and a gate conductor layer on the gate dielectric layer, wherein the gate conductor layer is integral with the word line corresponding to the gate conductor layer.

6. The storage device according to claim 5, wherein the gate stack surrounds the channel layer.

7. The storage device according to claim 5, further comprising:
an isolation layer disposed on the substrate, wherein the gate stack is stacked on the isolation layer,
wherein the gate dielectric layer extends to a surface of the isolation layer, a surface of the first source/drain layer, and a surface of the second source/drain layer.

8. The storage device according to claim 1, wherein for each pair of adjacent bit lines in the first direction, an end of one of the adjacent strips in the second direction and an end of the other one of the adjacent strips in the second direction are continuous.

9. The storage device according to claim 1, wherein each of the first source/drain layer and the second source/drain layer has a width of about 30 nm to 200 nm in a fourth direction orthogonal to the third direction, and the channel layer has a thickness of about 5 nm to 50 nm in the fourth direction.

10. The storage device according to claim 1, wherein the continuous first source/drain layers in each column have a varying thickness comprising a large thickness at an overlap between the second source/drain layer and the channel layer in the active region of each storage unit in the column and a small thickness at a remaining position.

11. An electronic apparatus, comprising the storage device according to claim 1, wherein the electronic apparatus comprises a smart phone, a personal computer, a tablet computer, a wearable device, an artificial intelligence device, or a portable power source.

12. A method for manufacturing a storage device, comprising:
providing a plurality of strips on a substrate such that the plurality of strips are spaced apart from each other in a first direction and continuously extend in a second direction in a zigzag shape, wherein each of the strips comprises a first source/drain layer, a channel layer and a second source/drain layer that are stacked sequentially in a vertical direction, the first direction and the second direction intersect, and each of the strips comprises a first segment extending in a third direction between the first direction and the second direction, and a second segment alternately provided with the first segment in the second direction;
defining active regions of a plurality of storage units through the plurality of strips respectively, wherein each of the active regions comprises a vertical stack of a first source/drain layer, a channel layer, and a second source/drain layer at a position of the first segment corresponding to the active region; a channel layer and a second source/drain layer in each vertical stack are discontinuous from a channel layer and a second source/drain layer in another vertical stack, and the first source/drain layers of the active regions defined through a same strip continuously extend to form a respective bit line; and vertical stacks defined through different strips are arranged in a row along the first direction, and vertical stacks defined through a same strip are arranged in a column along the second direction;
forming a gate stack in each of the storage units disposed between the first source/drain layer and the second source/drain layer in the vertical direction and sandwiching the channel layer from at least two opposite sides of the channel layer; and forming a plurality of word lines extending in the first direction on the substrate, wherein each of the word lines extends in the first direction to intersect the active regions of a respective row, and is electrically connected to the gate stacks of the storage units corresponding to the word line.

13. The method according to claim 12, wherein for each pair of adjacent strips in the first direction, an end of one of the adjacent strips in the second direction and an end of the other one of the adjacent strips in the second direction are continuous.

14. The method according to claim 12, wherein the defining respective active regions of a plurality of storage units through the plurality of strips comprises:

removing the second source/drain layer and the channel layer in regions other than regions where the vertical stacks are located in the plurality of strips, so as to expose the first source/drain layer.

15. The method according to claim 14, wherein the defining respective active regions of a plurality of storage units through the plurality of strips further comprises:

removing an upper portion of the first source/drain layer in the regions other than the regions where the vertical stacks are located in the plurality of strips.

16. The method according to claim 12, wherein, recess portions are defined between the first source/drain layer and the second source/drain layer of each of the storage units, wherein the recess portions are located on first and second opposite sides of the channel layer of the storage unit in a fourth direction orthogonal to the third direction, and the forming a plurality of word lines extending in the first direction comprises:

sequentially forming a gate dielectric layer and a gate conductor layer, wherein the gate dielectric layer and the gate conductor layer are filled into the recess portions to form the gate stack; and patterning the gate conductor layer into a word line extending in the first direction, wherein the gate conductor layer in the recess portions of each of the storage units and a respective word line are continuous.

17. The method according to claim 12, wherein the third direction is at an angle of about 30 degrees to 80 degrees with respect to the second direction.

18. The method according to claim 12, wherein the third direction is along a specific crystal face.

19. The method according to claim 18, wherein the crystal face comprises a (100) crystal face.

20. The method according to claim 12, wherein providing the vertical stack on the substrate comprises:

forming a stack of the first source/drain layer, the channel defining layer, and the second source/drain layer on the substrate;

forming a mandrel pattern on the stack, wherein the mandrel pattern comprises a plurality of strips spaced apart from each other in the first direction and continuously extending in the second direction in a zigzag shape, and each of the strips comprises a first segment extending in the third direction and a second segment alternately provided with the first segment in the second direction;

forming a spacer on sidewalls of the mandrel pattern;

patterning the stack into a ridge structure by using the mandrel pattern and the spacer as an etching mask;

performing a selective etching on the channel defining layer, such that the channel defining layer is laterally recessed with respect to the first source/drain layer and the second source/drain layer;

forming the channel layer on a sidewall of the channel defining layer by using an epitaxial growth process;

removing the mandrel pattern, and patterning the stack into a strip by using the spacer as an etching mask; and removing the channel defining layer.

\* \* \* \* \*